US012701669B2

(12) United States Patent
Dong et al.

(10) Patent No.: US 12,701,669 B2
(45) Date of Patent: Aug. 4, 2026

(54) ROTATING MECHANISM AND ELECTRONIC DEVICE

(71) Applicant: Honor Device Co., Ltd., Shenzhen (CN)

(72) Inventors: Shaohong Dong, Shenzhen (CN); Ruihao Chen, Shenzhen (CN); Gaofeng Peng, Shenzhen (CN); Changfu Dong, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 95 days.

(21) Appl. No.: 18/841,115

(22) PCT Filed: Sep. 6, 2023

(86) PCT No.: PCT/CN2023/117263
§ 371 (c)(1),
(2) Date: Aug. 23, 2024

(87) PCT Pub. No.: WO2024/061000
PCT Pub. Date: Mar. 28, 2024

(65) Prior Publication Data
US 2025/0185192 A1      Jun. 5, 2025

(30) Foreign Application Priority Data

Sep. 20, 2022    (CN) ......................... 202211146001.8

(51) Int. Cl.
*H05K 5/02* (2006.01)
*G06F 1/16* (2006.01)
*H04M 1/02* (2006.01)

(52) U.S. Cl.
CPC ......... *H05K 5/0226* (2013.01); *G06F 1/1624* (2013.01); *G06F 1/1652* (2013.01); *H04M 1/022* (2013.01); *H04M 1/0235* (2013.01)

(58) Field of Classification Search
CPC ... H05K 5/0226; G06F 1/1624; G06F 1/1652; G06F 1/1616; G06F 1/1681; H04M 1/022; H04M 1/0235
See application file for complete search history.

(56) References Cited

U.S. PATENT DOCUMENTS 10,664,021 B1     5/2020 Hsu et al.
11,846,997 B2 *  12/2023 Liao ................... H04M 1/0216
(Continued)

FOREIGN PATENT DOCUMENTS

CN       113067923 A      7/2021
CN       113194183 A      7/2021
(Continued)

OTHER PUBLICATIONS

Machine translation of KR 20220050543 (Year: 2026).*

*Primary Examiner* — Sagar Shrestha

(74) *Attorney, Agent, or Firm* — Leydig, Voit & Mayer, Ltd.

(57) ABSTRACT

This application provides an electronic device. The electronic device includes a rotating mechanism that includes a bracket, a first main swing arm, and a second main swing arm. A first rotating groove and a second rotating groove are disposed on the bracket and are distributed on two opposite sides of the bracket. The first rotating groove includes a first sliding rail and two second sliding rails that are disposed side by side in a length direction of the bracket, and the two second sliding rails are respectively located on two opposite sides of the first sliding rail. The first main swing arm is mounted in the first rotating groove. The first main swing arm can slide on the first sliding rail and the two second sliding rails, and can rotate relative to the bracket.

9 Claims, 9 Drawing Sheets

(56)     References Cited

U.S. PATENT DOCUMENTS

| | | | |
|---|---|---|---|
| 11,889,644 B2 * | 1/2024 | Yang ..................... | H04M 1/022 |
| 11,977,421 B2 * | 5/2024 | Yang ..................... | G06F 1/1681 |
| 12,405,638 B2 * | 9/2025 | Hsu ....................... | G06F 1/1652 |
| 12,510,938 B2 * | 12/2025 | Hong ................... | G06F 1/1681 |
| 2019/0391618 A1 * | 12/2019 | Hsu ....................... | G06F 1/1616 |
| 2022/0303371 A1 * | 9/2022 | Liao .................... | H04M 1/0216 |
| 2023/0171334 A1 * | 6/2023 | Xu ........................ | H04M 1/022 |
| | | | 455/566 |
| 2023/0384839 A1 | 11/2023 | Cheng et al. | |
| 2023/0403347 A1 * | 12/2023 | Liu ....................... | G06F 1/1681 |
| 2023/0409090 A1 * | 12/2023 | Hong ................... | G06F 1/1616 |
| 2024/0004430 A1 | 1/2024 | Zhao et al. | |
| 2024/0028086 A1 * | 1/2024 | Feng ................... | G06F 1/1652 |
| 2024/0032226 A1 * | 1/2024 | Jiang ................... | G06F 1/1652 |
| 2024/0073303 A1 * | 2/2024 | Zhang ................... | G06F 1/1652 |
| 2024/0094785 A1 | 3/2024 | Cheng et al. | |
| 2024/0206093 A1 * | 6/2024 | Liao ................... | H04M 1/0268 |
| 2024/0247683 A1 * | 7/2024 | Hong ................... | F16C 11/04 |
| 2024/0340365 A1 * | 10/2024 | Liao ..................... | G06F 1/1616 |
| 2024/0384751 A1 * | 11/2024 | Wu ........................ | F16C 11/04 |

FOREIGN PATENT DOCUMENTS

| | | |
|---|---|---|
| CN | 114909388 A | 8/2022 |
| CN | 116658512 A | 8/2023 |
| KR | 1020220050543 A | 4/2022 |
| WO | 2021115462 A1 | 6/2021 |
| WO | 2022001769 A1 | 1/2022 |
| WO | 2022143478 A1 | 7/2022 |
| WO | 2022171050 A1 | 8/2022 |

* cited by examiner

400

400

400

400

401

ROTATING MECHANISM AND ELECTRONIC DEVICE

CROSS-REFERENCE TO RELATED APPLICATIONS

This application is a national stage of International Application No. PCT/CN2023/117263, filed on Sep. 6, 2023, which claims priority to Chinese Patent Application No. 202211146001.8, filed on Sep. 20, 2022. The disclosures of both of the aforementioned applications are hereby incorporated by reference in their entireties.

TECHNICAL FIELD

This application relates to the field of electronic product technologies, and in particular, to a rotating mechanism and an electronic device.

BACKGROUND

As technologies of a flexible foldable screen become more mature, a foldable terminal product is more widely applied. The foldable terminal product (such as a foldable mobile phone, a foldable tablet, or a foldable computer) needs to satisfy a good appearance form and good experience, to be accepted by a consumer. Currently, the foldable terminal product often implements a rotating movement by using a swing arm mounted on a shaft cover bracket. However, existing arrangement of a structure of a sliding groove of the swing arm easily affects a thickness of the entire machine.

SUMMARY

Embodiments of this application provide a rotating mechanism and an electronic device. Arrangement of a structure of the rotating mechanism is conductive to reducing a thickness of an entire machine on a basis of ensuring a rotating movement of a swing arm.

According to a first aspect, this application provides a rotating mechanism. The rotating mechanism includes a bracket, a first main swing arm, and a second main swing arm.

A first rotating groove and a second rotating groove are disposed on the bracket. The first rotating groove and the second rotating groove are distributed on two opposite sides of the bracket.

The first rotating groove includes a first sliding rail and two second sliding rails. The two second sliding rails are respectively located on two opposite sides of the first sliding rail, and are disposed side by side with the first sliding rail in a length direction of the bracket. The first main swing arm is mounted in the first rotating groove. The first main swing arm can slide on the first sliding rail and the two second sliding rails. The first main swing arm can rotate relative to the bracket.

The second rotating groove includes a third sliding rail and two fourth sliding rails. The two fourth sliding rails are respectively located on two opposite sides of the third sliding rail, and are disposed side by side with the third sliding rail in the length direction of the bracket. The second main swing arm is mounted in the second rotating groove. The second main swing arm can slide on the third sliding rail and the two fourth sliding rails. The second main swing arm can rotate relative to the bracket. A rotation direction of the second main swing arm is opposite to that of the first main swing arm.

It may be understood that, the first sliding rail and the second sliding rail enable the swing arms to slide thereon. Through a sliding movement of the swing arms on the first sliding rail and the second sliding rail, a rotating movement of the swing arms and the bracket can be implemented. Under this arrangement, the first rotating groove (a sliding groove of the swing arm) is disposed on the bracket, so that space on the bracket can be fully utilized to properly arrange a structure of the first rotating groove. In comparison with a structure in which the sliding groove of the swing arm is disposed on the swing arm in a conventional technology, the swing arm occupies small space in a folded state, to help implement lightening and thinning of an entire machine.

In addition, the first sliding rail and the two second sliding rails are disposed in the first rotating groove, so that a sliding trajectory of the swing arm is jointly limited by the first sliding rail and the two second sliding rails. On one hand, the sliding trajectory of the swing arm is jointly limited by the first sliding rail and the two second sliding rails, so that a precision requirement on the first rotating groove can be reduced, thereby reducing machining difficulty and machining costs of the bracket. On the other hand, the sliding trajectory of the swing arm is jointly limited by the first sliding rail and the two second sliding rails, so that the first sliding rail and the two second sliding rails are arranged in a distributed manner. The plurality of sliding rails arranged in the distributed manner can increase strength of the first rotating groove, so that the swing arm is not easily deformed and stuck when the swing arm slides on the sliding rails, and reliability is good.

An effect of the second rotating groove is the same.

In a possible implementation, the first main swing arm includes a first sliding portion and two second sliding portions. The two second sliding portions are connected to two opposite sides of the first sliding portion. The first sliding portion is mounted on the first sliding rail. Each second sliding portion is mounted on one second sliding rail.

Under this arrangement, a structure of a first rotating body can match the structure of the first rotating groove of the bracket, a structure of the first sliding portion can match a structure of the first sliding rail, and a structure of the second sliding portion can match a structure of the second sliding rail, to facilitate a smooth rotating movement of the first main swing arm relative to the bracket.

In a possible implementation, the first sliding portion and the two second sliding portions cooperate to form a first concave area. The first sliding rail is partially located in the first concave area.

Under this arrangement, the first sliding portion is concave inward relative to the two second sliding portions. When the first sliding portion slides on the first sliding rail, the first concave area formed by the first sliding portion being concave inward relative to the two second sliding portions can provide space to accommodate the first sliding rail, to help improve space utilization of the rotating mechanism in a limited space layout, and reliability is good.

In a possible implementation, a first through hole is disposed on the first main swing arm. The first through hole is in communication with the first concave area. The first through hole is for the first sliding rail to pass through.

Under this arrangement, the first sliding rail and a rotating movement of the first main swing arm can be prevented from affecting each other, to effectively avoid a problem that the rotating mechanism is stuck because the first sliding rail hinders the rotation of the first main swing arm.

In a possible implementation, the first sliding rail includes two first convex portions disposed opposite to each other. A surface that is of each first convex portion and that is away from a bottom wall of the first rotating groove is in contact with the first sliding portion. Each first convex portion includes a first end and a second end, and the first end is disposed closer to an edge of the bracket in comparison with the second end. A height of a cross section that is of each first convex portion and that is in a direction perpendicular to the bottom wall of the first rotating groove gradually decreases from the first end to the second end.

Under this arrangement, the first end can be a high point position in the first convex portion, and the second end can be a low point position in the first convex portion, so that a rail path of the first sliding rail is arranged to gradually approach from the edge of the bracket to a center of the bracket from high to low; to help fully utilize structure space of the bracket, so as to achieve a rail arrangement in which the first sliding rail has a high-low drop and an inclined angle, and reliability is good.

In a possible implementation, the rotating mechanism further includes a base. The bracket is fixed to the base. A mounting column is disposed on the base. The first sliding rail further includes a first connecting portion. The first connecting portion is connected between the first ends of the two first convex portions. The first connecting portion and the two first convex portions cooperate to enclose mounting space. A mounting hole is disposed on the bracket. The mounting hole is located between the two first convex portions and disposed close to the first connecting portion. The mounting column passes through the mounting hole. The mounting column is located in the mounting space.

Under this arrangement, on one hand, when the bracket and the base are assembled, rapid positioning can be implemented through a corresponding arrangement of the mounting hole and the mounting column, to help easily and quickly assemble the bracket to the base. On the other hand, a clamping connection between the bracket and the base can be implemented through the corresponding arrangement of the mounting hole and the mounting column, so that a relative movement between the bracket and the base is limited, and it is ensured that a displacement situation such as incline, misalignment, or shaking does not occur between the bracket and the base. In addition, the mounting column may be accommodated in the mounting space formed through the cooperation of the first connecting portion and the two convex portions, so that the space of the bracket can be fully utilized without additionally occupying space of the rotating mechanism, to effectively improve space utilization of the bracket.

In a possible implementation, each first sliding rail includes a first bump and a first rail structure. The first bump is connected to a side wall of the first rotating groove. The first rail structure is connected to the bottom wall of the first rotating groove. The first bump and the first rail structure are disposed at intervals. The second sliding portion is located in a gap area between the first bump and the first rail structure.

The first bump is disposed on the side wall of the first rotating groove, so that the swing arm mounted in the first rotating groove can be limited, to help avoid a case that the swing arm mounted in the first rotating groove leaves the first rotating groove. For example, the first rail structure may be curved.

In a possible implementation, a first hollowed-out portion is disposed on the first rail structure. The first hollowed-out portion is disposed opposite to the first bump. The first hollowed-out portion penetrates the bottom wall of the first rotating groove.

It may be understood that, the arrangement of the first hollowed-out portion can enable the bracket to be made through mold shaping, thereby simplifying a machining process of the bracket, to help reduce production costs and improve production efficiency.

In a possible implementation, the first rotating groove and the second rotating groove are of an integrated structure.

It may be understood that, both the first rotating groove and the second rotating groove are of the integrated structure. In comparison with an assembled structure in which the rotating groove is formed by splicing a plurality of parts in a conventional technology, the first rotating groove and the second rotating groove that are of the integrated structure have advantages such as no disassembling, a small quantity of parts, simple machining and manufacturing, low costs, and high size precision. An adverse effect caused by a problem caused by the splicing of the plurality of parts, such as large assembly tolerance, existence of a diastema and misalignment, high welding difficulty, and high repair difficulty, can be minimized, and reliability is good.

In a possible implementation, the rotating mechanism further includes the base. The bracket is fixed to the base. Orthographic projections that are of the first rotating groove and the second rotating groove and that are on the base entirely fall on the base.

It may be understood that, because the orthographic projections of the first rotating groove and the second rotating groove entirely fall on the base, the bracket is enabled to match arrangement of the structures of the first rotating groove and the second rotating groove, and the bracket is also located in a space range defined by the base, so that a size of the bracket can match a size of the base, and the bracket do not protrude relative to the base. In other words, the first rotating groove and the second rotating groove do not protrude relative to the base. Under this arrangement, impact on a thickness of the entire machine due to the protruding of the bracket relative to the base can be minimized, to help implement lightening and thinning of the entire machine.

According to a second aspect, this application further provides an electronic device. The electronic device includes a first housing, a second housing, and the foregoing rotating mechanism. The rotating mechanism is connected between the first housing and the second housing.

DESCRIPTION OF EMBODIMENTS

For ease of understanding, terms in embodiments of this application are first described.

A term "and/or" describes only an association relationship for describing associated objects and represents that three relationships may exist. For example, A and/or B may represent the following three cases: only A exists, both A and B exist, and only B exists.

A term "a plurality of" refers to two or more.

A term "connection" should be understood in a broad sense. For example, a connection between A and B may be a direct connection between A and B, or an indirect connection between A and B by using an intermediary.

The following describes specific implementations of this application in detail with reference to the accompanying drawings.

Embodiments of this application provide a rotating mechanism and an electronic device using the rotating mechanism. Arrangement of a structure of the rotating mechanism is conductive to reducing a thickness of an entire machine on a basis of ensuring a rotating movement of a swing arm.

The electronic device may be any device with foldable performance, and can be unfolded and folded through an operation of a user. The electronic device includes but is not limited to a mobile phone (cell phone), a notebook computer, a tablet personal computer (tablet), a laptop computer (laptop), a personal digital assistant (PDA), a wearable device, a vehicle-mounted device, mobile device, or the like. In embodiments of this application, an example in which the electronic device is a mobile phone is used for description.

Figure 1:
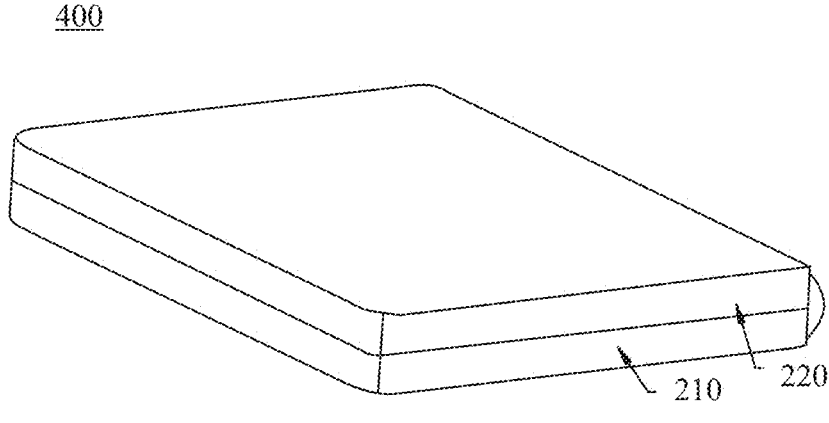
FIG. 1 is a simplified schematic diagram of a structure of an electronic device in a folded state according to an embodiment of this application.
Figure 2:
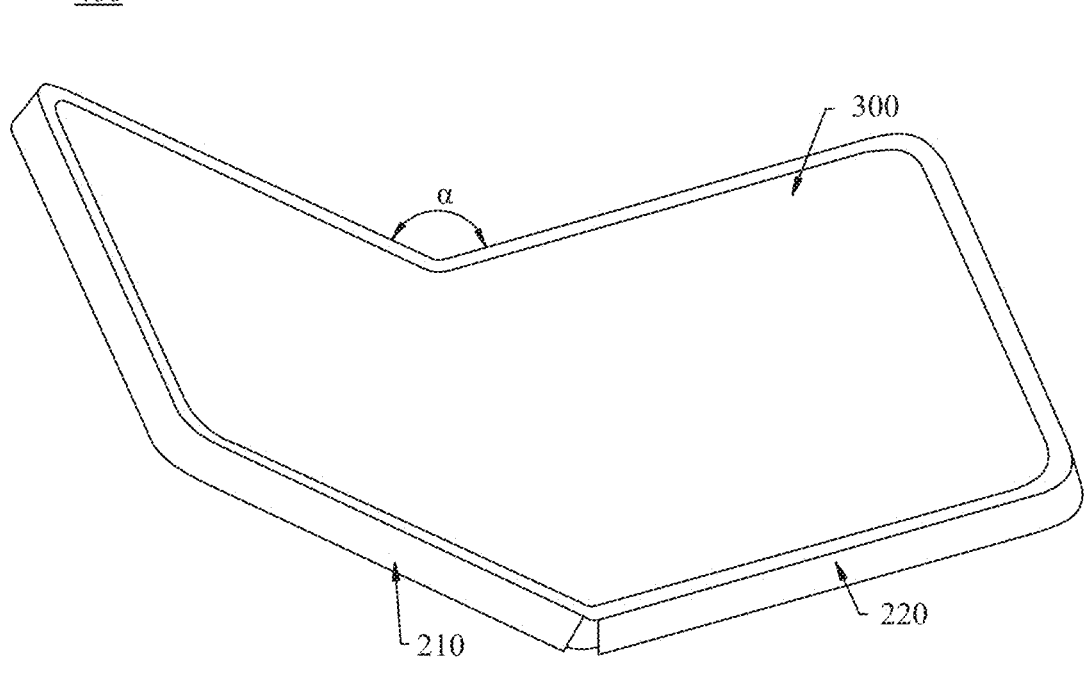
FIG. 2 is a simplified schematic diagram of a structure of the electronic device shown in FIG. 1 in an intermediate state.
Figure 3:
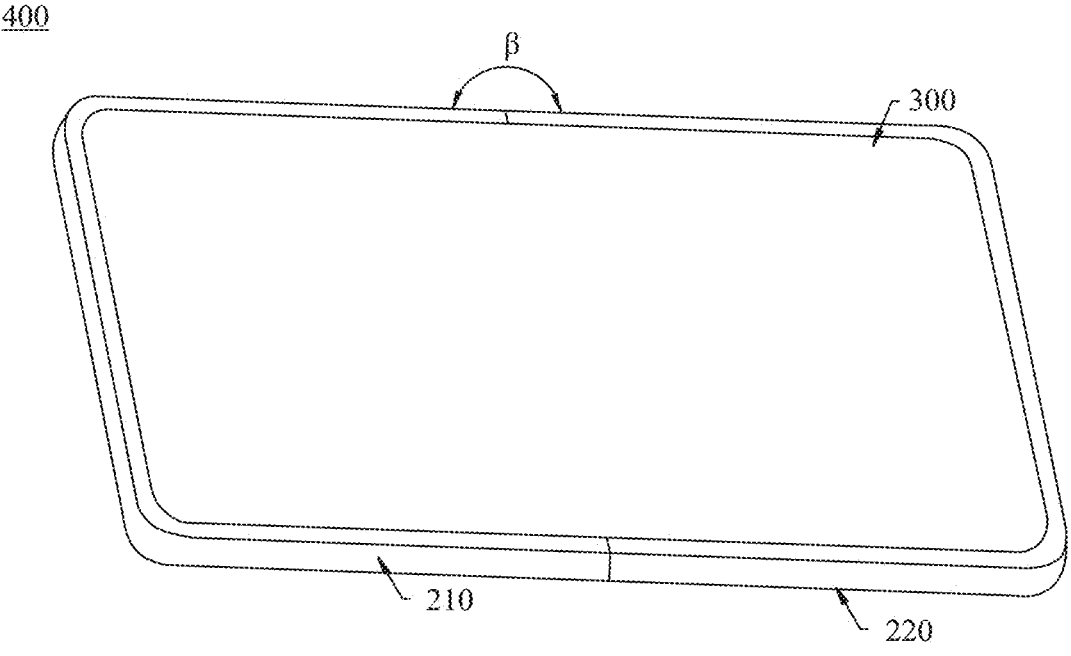
FIG. 3 is a simplified schematic diagram of a structure of the electronic device shown in FIG. 1 in an unfolded state.

FIG. 1 is a simplified schematic diagram of a structure of an electronic device 400 in a folded state according to an embodiment of this application. FIG. 2 is a simplified schematic diagram of a structure of the electronic device 400 shown in FIG. 1 in an intermediate state. FIG. 3 is a simplified schematic diagram of a structure of the electronic device 400 shown in FIG. 1 in an unfolded state. An unfolding angle $\alpha$ of the electronic device 400 shown in FIG. 2 is 120 degrees, and an unfolding angle $\beta$ of the electronic device 400 shown in FIG. 3 is 180 degrees. For ease of description, a length direction of the electronic device 400 is defined as a direction X, a width direction of the electronic device 400 is defined as a direction Y, and a thickness direction of the electronic device 400 is defined as a direction Z. The direction X, the direction Y, and the direction Z are perpendicular to each other.

It should be noted that the angle illustrated in this embodiment of this application is allowed to have a slight deviation. For example, that the unfolding angle $\alpha$ of the electronic device 400 shown in FIG. 2 is 120 degrees means that a may be 120 degrees or approximately 120 degrees, such as 110 degrees, 115 degrees, 125 degrees, or 130 degrees. That the unfolding angle $\beta$ of the electronic device 400 shown in FIG. 3 is 180 degrees means that $\beta$ may be 180 degrees or approximately 180 degrees, such as 0 degrees, 5 degrees, 185 degrees, or 190 degrees. An angle used as an example for description in the following specification may be understood in a same way.

The electronic device 400 shown in this embodiment of this application is an electronic device that can be folded once. In some other embodiments, the electronic device 400 may alternatively be an electronic device that can be folded for a plurality of times (at least twice). In this case, the electronic device 400 may include a plurality of parts. Two adjacent parts may be folded relatively close to each other until the electronic device 400 is in a folded state, and the two adjacent parts may be unfolded relatively away from each other until the electronic device 400 is in an unfolded state.

Figure 4:
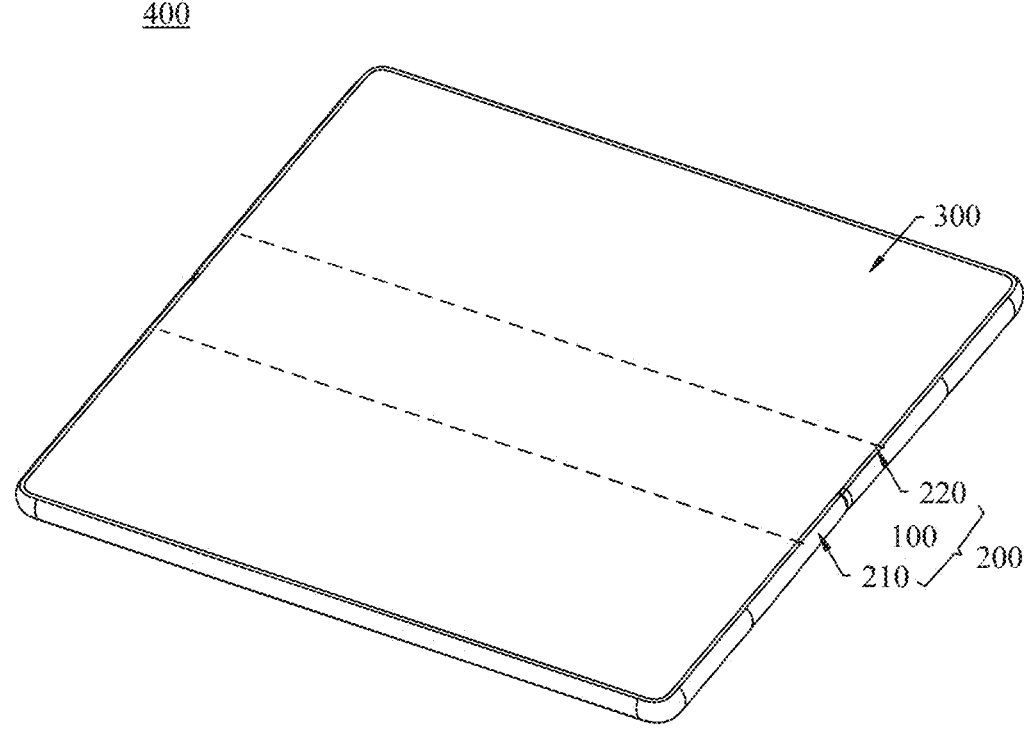
FIG. 4 is a schematic diagram of a structure of an electronic device according to an embodiment of this application.
Figure 5:
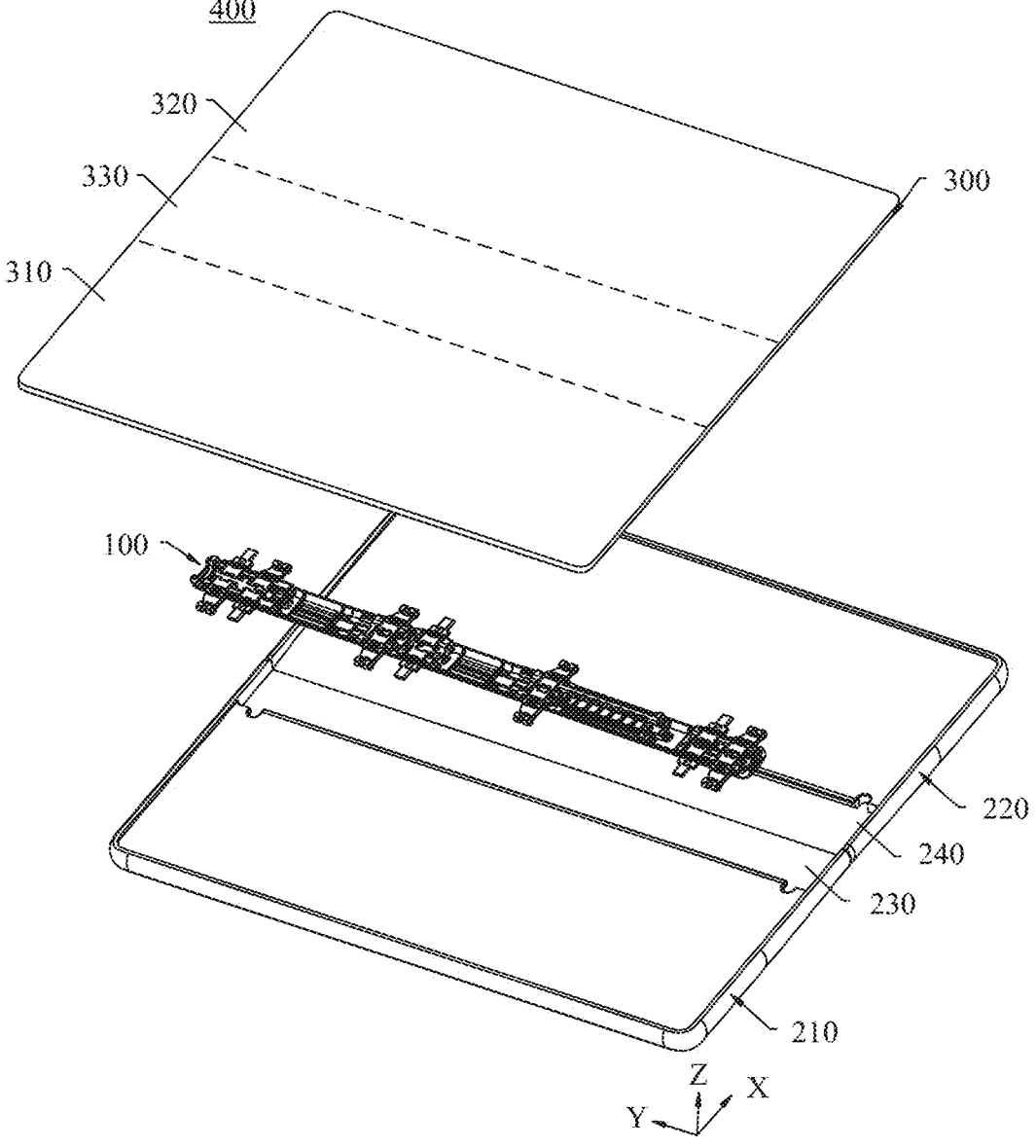
FIG. 5 is a schematic exploded view of the electronic device shown in FIG. 4.

FIG. 4 is a schematic diagram of a structure of an electronic device 400 according to an embodiment of this application. FIG. 5 is a schematic exploded view of the electronic device 400 shown in FIG. 4.

Refer to FIG. 4 and FIG. 5 together. The electronic device 400 includes a foldable apparatus 200 and a flexible display screen 300. The flexible display screen 300 is mounted on the foldable apparatus 200. The flexible display screen 300 includes a first part 310, a second part 320, and a foldable part 330. The foldable part 330 is located between the first part 310 and the second part 320, and the foldable part 330 may be bent. The first part 310, the second part 320, and the foldable part 330 jointly constitute the flexible display screen 300.

In this embodiment, the flexible display screen 300 may be an organic light-emitting diode (OLED) display, an active-matrix organic light-emitting diode (AMOLED) display, a mini light-emitting diode (mini LED) display, a micro light-emitting diode (micro LED) display, a micro organic light-emitting diode (micro OLED) display, or a quantum dot light-emitting diode (QLED) display.

The foldable apparatus 200 includes a first housing 210, a second housing 220, and a rotating mechanism 100. A first accommodating groove 230 is disposed on the first housing 210. A second accommodating groove 240 is disposed on the second housing 220. The first accommodating groove 230 is in communication with the second accommodating groove 240 to form an accommodating groove. The rotating mechanism 100 is mounted in the accommodating groove and fixedly connected to the first housing 210 and the second housing 220, to achieve a rotating connection between the first housing 210 and the second housing 220. The first housing 210 and the second housing 220 may rotate relative to each other through the rotating mechanism 100, so that the foldable apparatus 200 switches between the folded state and the unfolded state. Accommodating space (not shown in the figure) is further disposed between the first housing 210 and the second housing 220. The accommodating space is for accommodating an electronic element, such as a processor, a circuit board, or a camera module, and a structural element of the electronic device 400.

As shown in FIG. 1, that the relative rotation of the first housing 210 and the second housing 220 enables the foldable apparatus 200 to be in the folded state means that the first housing 210 and the second housing 220 rotate through the rotating mechanism 100 and approach each other. Surfaces that are of the first housing 210 and the second housing 220 and that carry the flexible display screen 300 are opposite to each other. Actually, during application, when the foldable apparatus 200 is in a fully folded state, after the flexible display screen 300 mounted on the first housing 210 and the second housing 220 is folded, the first part 310 and the second part 320 are stacked and partially in contact, or certainly, may be fully in contact.

As shown in FIG. 2, that the relative rotation of the first housing 210 and the second housing 220 enables the foldable apparatus 200 to be in an intermediate state means that the first housing 210 and the second housing 220 rotate through the rotating mechanism 100 and move away from each other, and an included angle between the first housing 210 and the second housing 220 becomes larger. Alternatively, it means that the first housing 210 and the second housing 220 rotate through the rotating mechanism 100 and approach each other, and the included angle between the first housing 210 and the second housing 220 becomes smaller.

As shown in FIG. 3, that the relative rotation of the first housing 210 and the second housing 220 enables the foldable apparatus 200 to be in an unfolded state means that the first housing 210 and the second housing 220 rotate through the rotating mechanism 100 and move away from each other, and the included angle between the first housing 210 and the second housing 220 continues to increase, and may be close to 180 degrees or equal to 180 degrees. The flexible display screen 300 is connected to the foldable apparatus 200. Specifically, the first housing 210 carries the first part 310 of the flexible display screen 300, the second housing 220 carries the second part 320 of the flexible display screen 300, and the foldable part 330 of the flexible display screen 300 is disposed opposite to the rotating mechanism 100. It may be understood that, the first housing 210 and the second housing 220 rotate relative to each other through the rotating mechanism 100. The first housing 210 and the second housing 220 relatively approach each other to drive the flexible display screen 300 to be folded, so that electronic device 400 is folded. When the electronic device 400 is in the folded state, the foldable part 330 of the flexible display screen 300 is bent, and the first part 310 is disposed opposite to the second part 320. In this case, the flexible display screen 300 is located between the first housing 210 and the second housing 220, so that a probability of damaging the flexible display screen 300 can be greatly reduced, and the flexible display screen 300 is effectively protected.

In this embodiment of this application, the first housing 210 and the second housing 220 rotate relative to each other through the rotating mechanism 100. The first housing 210 and the second housing 220 relatively move away from each other to drive the flexible display screen 300 to be unfolded, so that electronic device 400 is unfolded to the intermediate state. When the electronic device 400 is in the intermediate state, the first housing 210 and the second housing 220 are unfolded to have an included angle α. The first part 310 and the second part 320 are unfolded relative to each other, and drive the foldable part 330 to be unfolded. In this case, the included angle between the first part 310 and the second part 320 is α. In this embodiment, α is 120 degrees. In another embodiment, a may alternatively be approximately 120 degrees, such as 110 degrees, 115 degrees, 125 degrees, or 130 degrees.

The first housing 210 and the second housing 220 rotate relative to each other through the rotating mechanism 100. The first housing 210 and the second housing 220 relatively move away from each other to drive the flexible display screen 300 to be further unfolded until the electronic device 400 is unfolded. When the foldable apparatus 200 is in the unfolded state, an included angle between the first housing 210 and the second housing 220 is β. The foldable part 330 is unfolded, and the first part 310 and the second part 320 are unfolded relative to each other. In this case, included angles between the first part 310, the second part 320, and the foldable part 330 are all B. The flexible display screen 300 has a large display area, to implement large-screen display of the electronic device 400 and improve user experience. In this embodiment, β is 180 degrees. In another embodiment, β may alternatively be approximately 180 degrees, such as 0 degrees, 5 degrees, 185 degrees, or 190 degrees.

Figure 6:
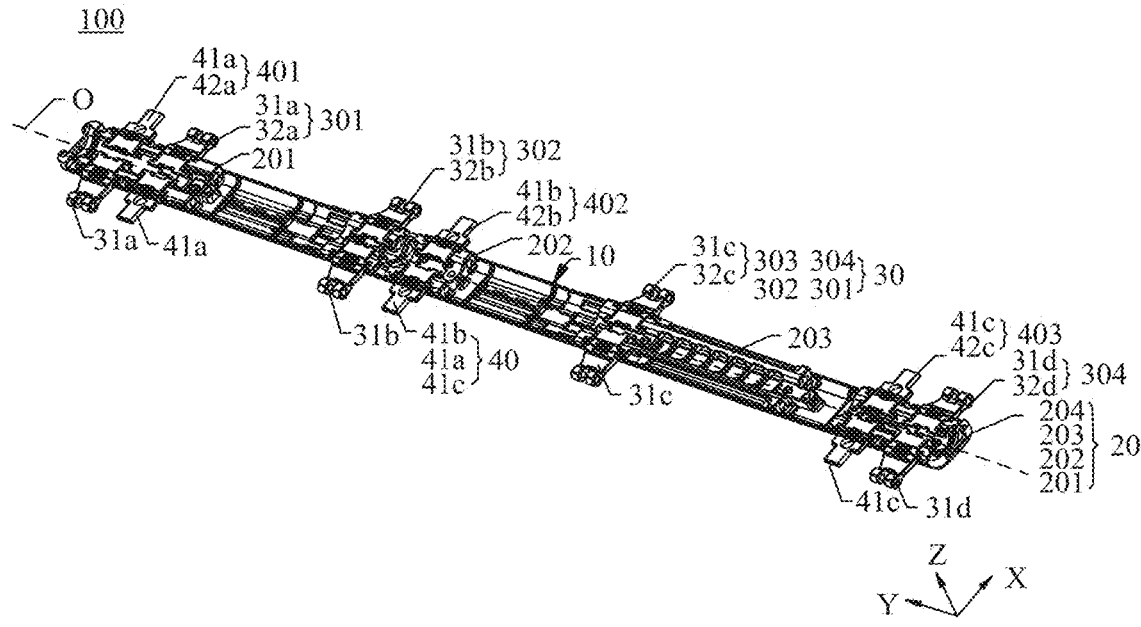
FIG. 6 is a schematic diagram of a structure of a rotating mechanism of the electronic device shown in FIG. 5.
Figure 7:
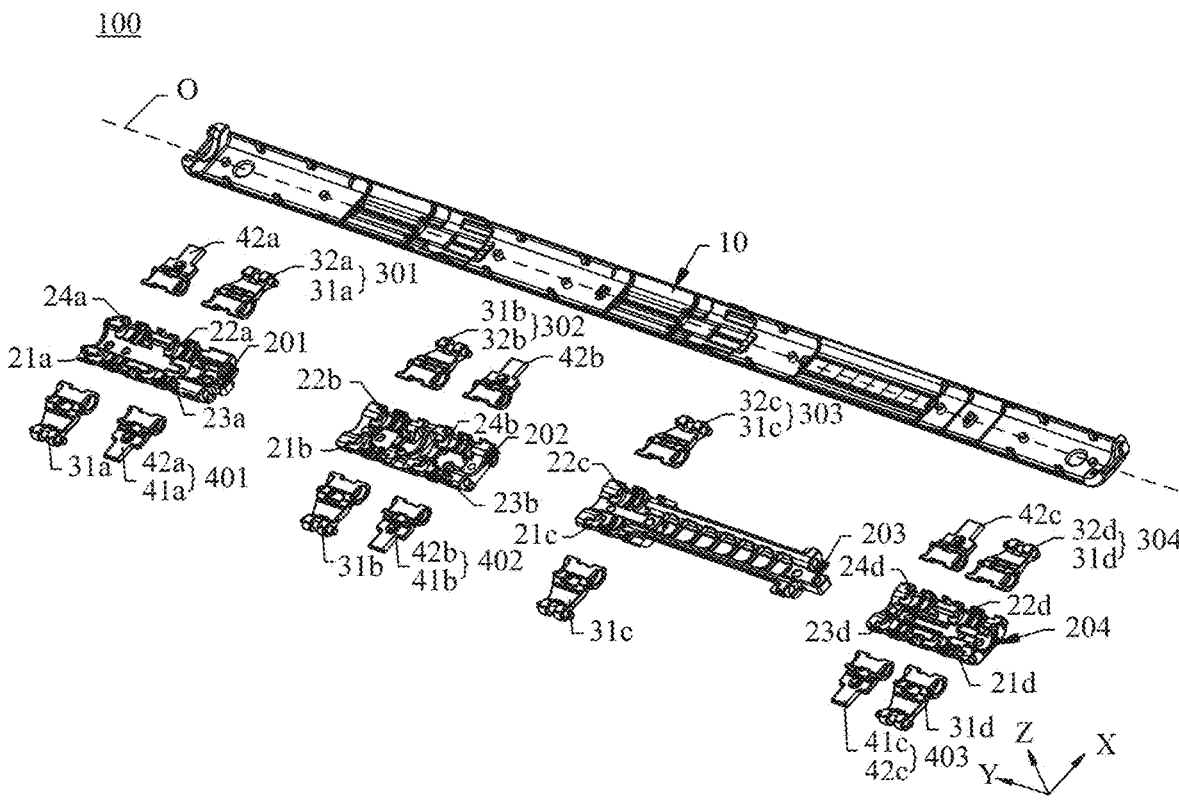
FIG. 7 is a schematic exploded view of the rotating mechanism shown in FIG. 6.

Refer to FIG. 6 and FIG. 7 together. FIG. 6 is a schematic diagram of a structure of the rotating mechanism 100 of the electronic device shown in FIG. 5. FIG. 7 is a schematic exploded view of the rotating mechanism 100 shown in FIG. 6.

The rotating mechanism 100 may include a base 10, a bracket 20, a rotating swing arm assembly 30, and a pressing plate swing arm assembly 40. The bracket 20 is mounted on the base 10, and the bracket 20 is fixedly connected to the base 10. The rotating swing arm assembly 30 is mounted on the bracket 20 and may rotate relative to the bracket 20. A rotating connection between the base 10 and the rotating swing arm assembly 30 can be implemented through a rotating connection between the rotating swing arm assembly 30 and the bracket 20. The pressing plate swing arm assembly 40 is mounted on the bracket 20 and may rotate relative to the bracket 20. A rotating connection between the base 10 and the pressing plate swing arm assembly 40 can be implemented through a rotating connection between the pressing plate swing arm assembly 40 and the bracket 20. For example, the pressing plate swing arm assembly 40 may be slidably and rotatably connected to the rotating swing arm assembly 30. When the rotating swing arm assembly 30 rotates relative to the base 10, the pressing plate swing arm assembly 40 is driven to rotate relative to the base 10, thereby implementing the rotation of the rotating mechanism 100, so that the rotating mechanism 100 switches between the folded state and the unfolded state.

For ease of description, a symmetry axis O (as shown in FIG. 6) is disposed in this embodiment of this application. The symmetry axis O is perpendicular to a direction X, and the symmetry axis O passes through a center of the rotating mechanism 100.

It should be noted that, FIG. 6 and FIG. 7 are only intended to schematically describe a connection relationship between the base 10, the bracket 20, and the rotating swing arm assembly 30, and are not to specifically limit a connection position, a specific structure, and a quantity of each device. The structure illustrated in this embodiment of this application does not constitute a specific limitation on the rotating mechanism 100. In some other embodiments of this application, the rotating mechanism 100 may include more or fewer components than those shown in the figure, or some components may be combined, or some components may be split, or components are arranged in different manners. The components shown in the figure may be implemented by hardware, software, or a combination thereof.

Figure 8:
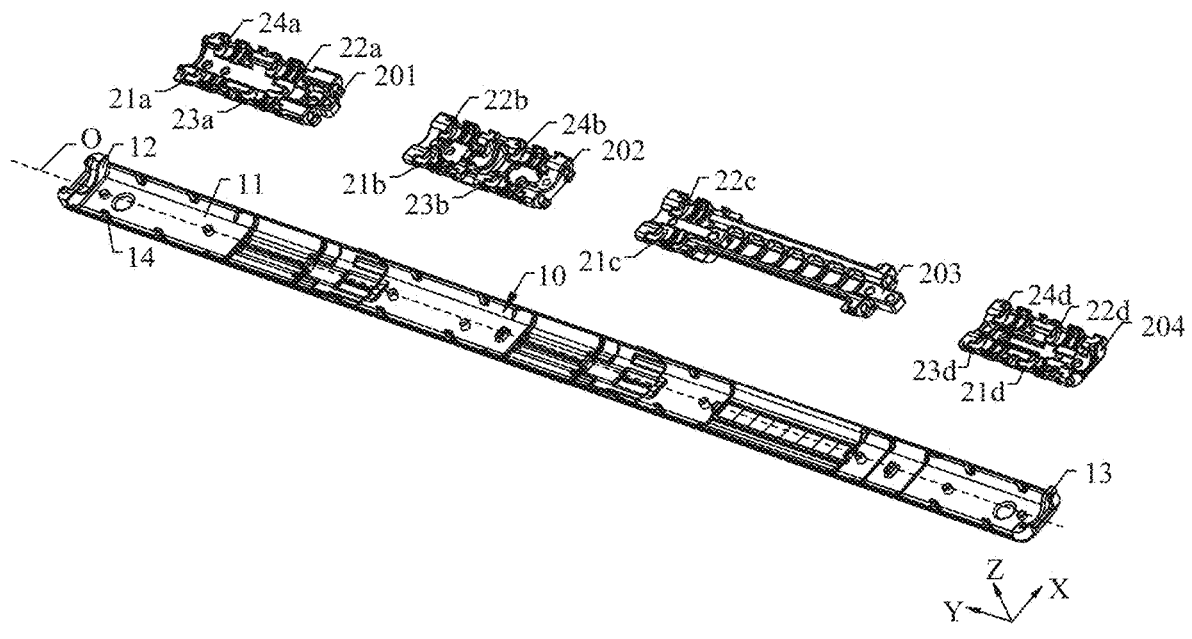
FIG. 8 is a schematic diagram of structures of a base and a bracket of the rotating mechanism shown in FIG. 6.
Figure 9:
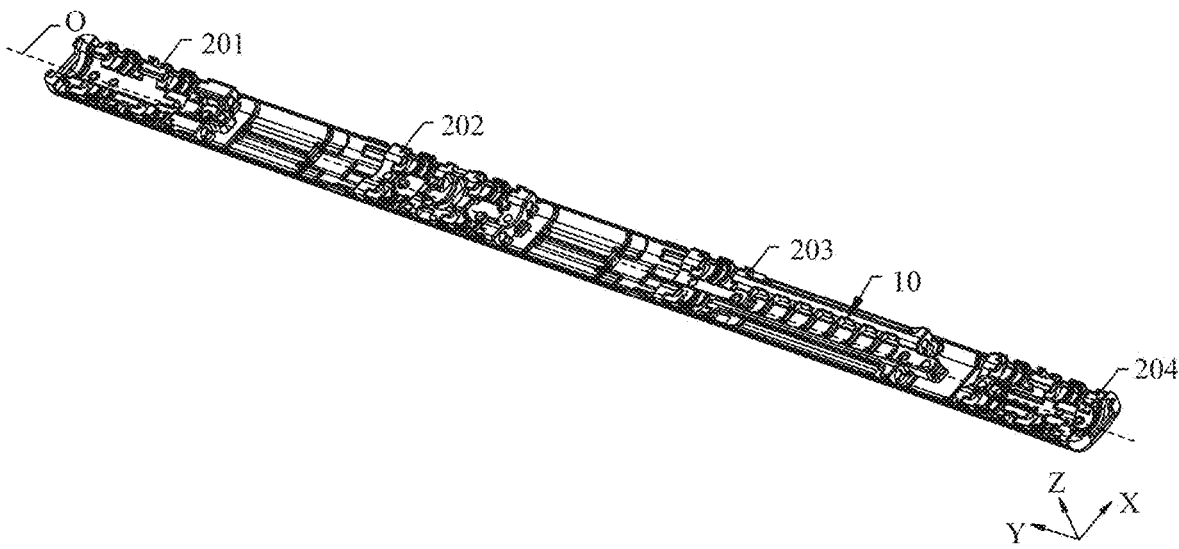
FIG. 9 is a schematic diagram of assembling of the bracket and the base shown in FIG. 8.

Refer to FIG. 8 and FIG. 9. FIG. 8 is a schematic diagram of structures of the base 10 and the bracket 20 of the rotating mechanism 100 shown in FIG. 6. FIG. 9 is a schematic diagram of assembling of the bracket 20 and the base 10 shown in FIG. 8. The base 10 may include a bottom plate 11, a first end plate 12, and a second end plate 13. The first end plate 12 and the second end plate 13 are respectively connected to two sides of the bottom plate 11. The first end plate 12 is disposed opposite to the second end plate 13 in the direction Y. A plurality of mounting columns 14 are disposed on the bottom plate 11. The plurality of mounting columns 14 are disposed on the bottom plate 11 at intervals. In the direction X, the plurality of mounting columns 14 on one side of the bottom plate 11 and the plurality of mounting columns 14 on the other side of the bottom plate 11 are symmetrically disposed relative to the symmetry axis O.

The bracket 20 is fixedly connected to the base 10. The bracket 20 is disposed opposite to the bottom plate 11 of the base 10. For example, the bracket 20 and the base 10 may be fixedly connected in a manner of using a bolt, using glue, welding, or the like. In this embodiment of this application, the bracket 20 includes four sub-brackets. The four sub-brackets are of a separated structure in this embodiment. The four sub-brackets are a first sub-bracket 201, a second sub-bracket 202, a third sub-bracket 203, and a fourth sub-bracket 204. The first sub-bracket 201, the second sub-bracket 202, the third sub-bracket 203, and the fourth sub-bracket 204 are sequentially arranged in the direction Y. The first sub-bracket 201 is located on one side of a negative direction toward a Y-axis of the base 10, and the fourth sub-bracket 204 is located on one side of a positive direction toward the Y-axis. Certainly, in some other embodiments, the four sub-brackets may alternatively be of an integrally formed structure.

Figure 10:
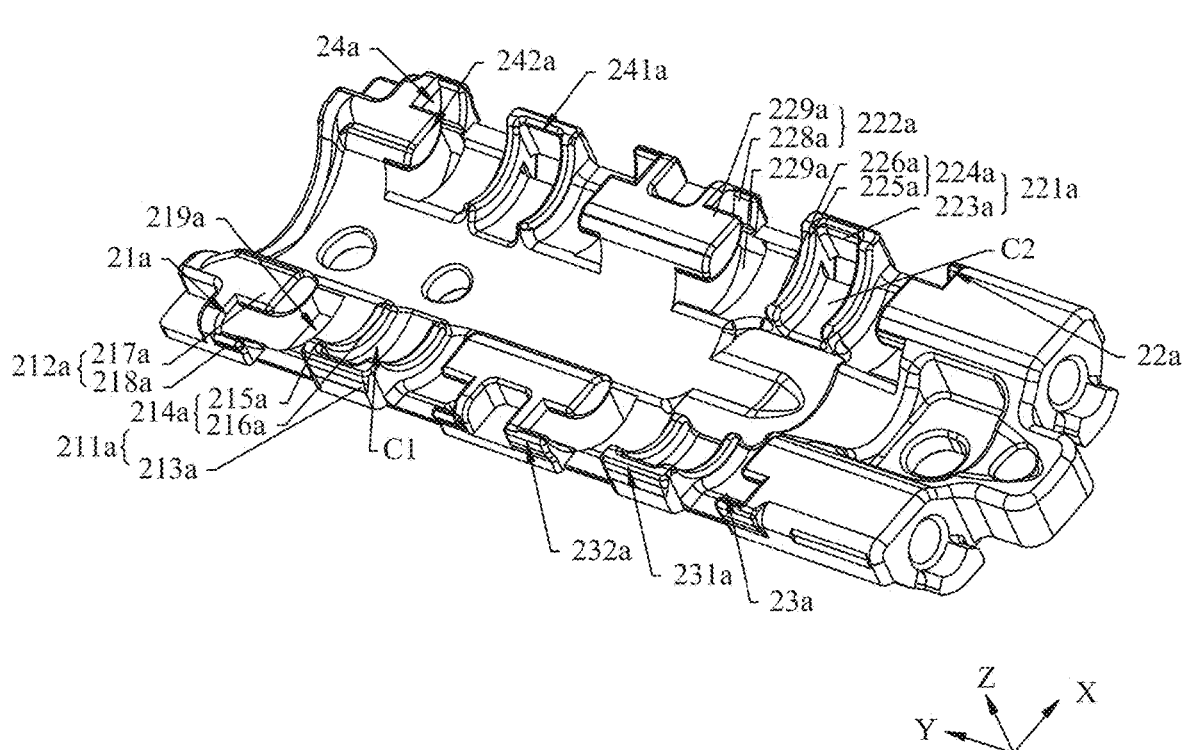
FIG. 10 is a schematic diagram of a structure of a first sub-bracket of a bracket shown in FIG. 6.

FIG. 10 is a schematic diagram of a structure of the first sub-bracket 201 of the bracket 20 shown in FIG. 6.

The first sub-bracket 201 is fixedly connected to the base 10. A first rotating groove 21a and a second rotating groove 22a are disposed on the first sub-bracket 201. The first rotating groove 21a and the second rotating groove 22a are disposed at intervals in both the direction X and the direction Y. Orthographic projections that are of the first rotating groove 21a and the second rotating groove 22a and that are on the base 10 may entirely fall on the base 10. It may be understood that, because the orthographic projections of the first rotating groove 21a and the second rotating groove 22a entirely fall on the base 10, the first sub-bracket 201 is enabled to match arrangement of structures of the first rotating groove 21a and the second rotating groove 22a, and the first sub-bracket 201 is also located in a space range defined by the base 10, so that a size of the first sub-bracket 201 can match a size of the base 10, and the first sub-bracket 201 do not protrude relative to the base 10. In other words, the first rotating groove 21a and the second rotating groove 22a do not protrude relative to the base 10. Under this arrangement, impact on a thickness of an entire machine due to the protruding of the first sub-bracket 201 relative to the base 10 can be minimized, to help implement lightening and thinning of the entire machine.

In this embodiment of this application, both the first rotating groove 21a and the second rotating groove 22a are of an integrated structure. In comparison with an assembled structure in which the rotating groove is formed by splicing a plurality of parts in a conventional technology, the first rotating groove 21a and the second rotating groove 22a that are of the integrated structure have advantages such as no disassembling, a small quantity of parts, simple machining and manufacturing, low costs, and high size precision. An adverse effect caused by a problem caused by the splicing of the plurality of parts, such as large assembly tolerance, existence of a diastema and misalignment, high welding difficulty, and high repair difficulty, can be minimized, and reliability is good.

Still refer to FIG. 10. The first rotating groove 21a may include a first sliding rail 211a and two second sliding rails 212a. The first sliding rail 211a is disposed on a bottom wall of the first rotating groove 21a. The two second sliding rails 212a are respectively located on two side walls that are disposed opposite to each other and that are of the first rotating groove 21a. The two second sliding rails 212a are respectively located on two opposite sides of the first sliding rail 211a. The two second sliding rails 212a are disposed side by side with the first sliding rail 211a in a length direction (the direction Y) of the bracket 20. For example, the bottom wall of the first rotating groove 21a is curved.

It may be understood that, the first sliding rail 211a and the second sliding rail 212a enable the swing arms to slide thereon. Through a sliding movement of the swing arms on the first sliding rail 211a and the second sliding rail 212a, a rotating movement of the swing arms and the first sub-bracket 201 can be implemented. Under this arrangement, the first rotating groove 21a (a sliding groove of the swing arm) is disposed on the first sub-bracket 201, so that space on the first sub-bracket 201 can be fully utilized to properly arrange a structure of the first rotating groove 21a. In comparison with a structure in which the sliding groove of the swing arm is disposed on the swing arm in a conventional technology, the swing arm occupies small space in a folded state, to help implement lightening and thinning of an entire machine.

In addition, the first sliding rail 211a and the two second sliding rails 212a are disposed in the first rotating groove 21a, so that a sliding trajectory of the swing arm is jointly limited by the first sliding rail 211a and the two second sliding rails 212a. On one hand, the sliding trajectory of the swing arm is jointly limited by the first sliding rail 211a and the two second sliding rails 212a, so that a precision requirement on the first rotating groove 21a can be reduced, thereby reducing machining difficulty and machining costs of the first sub-bracket 201. On the other hand, the sliding trajectory of the swing arm is jointly limited by the first sliding rail 211a and the two second sliding rails 212a, so that the first sliding rail 211a and the two second sliding rails 212a are arranged in a distributed manner. The plurality of sliding rails arranged in the distributed manner can increase strength of the first rotating groove 21a, so that the swing arm is not easily deformed and stuck when the swing arm slides on the sliding rails, and reliability is good.

Figure 11:
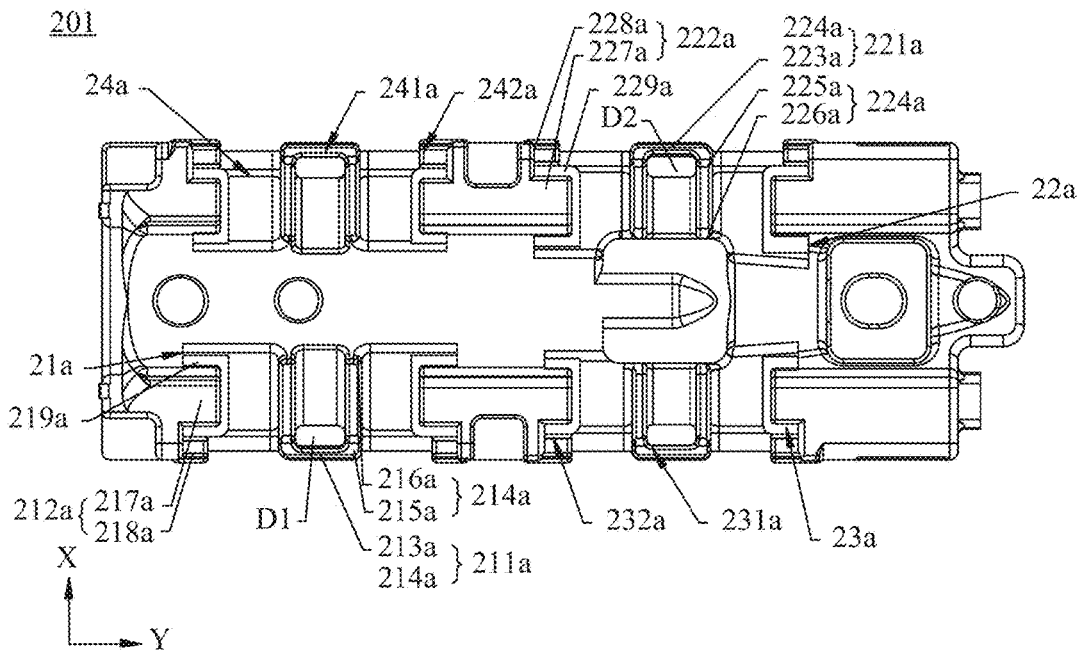
FIG. 11 is a schematic top view of the first sub-bracket shown in FIG. 10.

Refer to FIG. 10 and FIG. 11 together. FIG. 11 is a schematic top view of the first sub-bracket 201 shown in FIG. 10. The first sliding rail 211a may include a first connecting portion 213a and two first convex portions 214a. The first connecting portion 213a and the two first convex portions 214a are all connected to the bottom wall of the first rotating groove 21a. The two first convex portions 214a are disposed opposite to each other at intervals in the direction Y. A surface that is of each first convex portion 214a and that is away from the bottom wall of the first rotating groove 21a is a rail surface of the first sliding rail 211a. Each first convex portion 214a includes a first end 215a and a second end 216a. The first end 215a is an end that is of the first convex portion 214a and that is close to an edge of the first sub-bracket 201. The second end 216a is an end that is of the first convex portion 214a and that is away from the edge of the first sub-bracket 201. In other words, the first end 215*a* is disposed closer to the edge of the first sub-bracket 201 in comparison with the second end 216*a*. A height of a cross section that is of each first convex portion 214*a* and that is in a direction perpendicular to the bottom wall of the first rotating groove 21*a* gradually decreases from the first end 215*a* to the second end 216*a*. Under this arrangement, the first end 215*a* can be a high point position in the first convex portion 214*a*, and the second end 216*a* can be a low point position in the first convex portion 214*a*, so that a rail path of the first sliding rail 211*a* is arranged to gradually approach from the edge of the first sub-bracket 201 to a center of the first sub-bracket 201 from high to low; to help fully utilize structure space of the first sub-bracket 201, so as to achieve a rail arrangement in which the first sliding rail 211*a* has a high-low drop and an inclined angle, and reliability is good. For example, the first convex portion 214*a* may be curved. A bending direction of the first convex portion 214*a* is approximately the same as a bending direction of the bottom wall of the first rotating groove 21*a*.

The first connecting portion 213*a* is connected between the first ends 215*a* of the two first convex portions 214*a*. In other words, the first connecting portion 213*a* is disposed close to the edge of the first sub-bracket 201. The first connecting portion 213*a* and the two first convex portions 214*a* cooperate to enclose mounting space C1. A mounting hole D1 is disposed on a groove bottom wall of the first rotating groove 21*a*. The mounting hole D1 penetrates the groove bottom wall of the first rotating groove 21*a* in the direction Z. The mounting hole D1 is located between the two first convex portions 214*a* and disposed close to the first connecting portion 213*a*. The mounting hole D1 and a mounting column 14 on the base 10 are correspondingly disposed, so that the mounting column 14 on the base 10 can pass through the mounting hole D1 to be located in the mounting space C1. Under this arrangement, on one hand, when the first sub-bracket 201 and the base 10 are assembled, rapid positioning can be implemented through a corresponding arrangement of the mounting hole D1 and the mounting column 14, to help easily and quickly assemble the first sub-bracket 201 to the base 10. On the other hand, a clamping connection between the first sub-bracket 201 and the base 10 can be implemented through the corresponding arrangement of the mounting hole D1 and the mounting column 14, so that a relative movement between the first sub-bracket 201 and the base 10 is limited, and it is ensured that a displacement situation such as incline, misalignment, or shaking does not occur between the first sub-bracket 201 and the base 10. In addition, the mounting column 14 may be accommodated in the mounting space C1 formed through the cooperation of the first connecting portion 213*a* and the two convex portions, so that the space of the first sub-bracket 201 can be fully utilized without additionally occupying space of the rotating mechanism 100, to effectively improve space utilization of the first sub-bracket 201.

Still refer to FIG. 10 and FIG. 11. Each second sliding rail 212*a* is disposed at intervals with the first sliding rail 211*a*. The two second sliding rails 212*a* may be symmetrically distributed on two sides of the first sliding rail 211*a*. A bend direction of the two second sliding rails 212*a* may be the same as that of the first sliding rail 211*a*. Each second sliding rail 212*a* includes a first bump 217*a* and a first rail structure 218*a*. The first bump 217*a* is connected to a side wall of the first rotating groove 21*a*. The first rail structure 218*a* is connected to the bottom wall of the first rotating groove 21*a*. The first bump 217*a* and the first rail structure 218*a* are disposed at intervals. A gap area between the first bump

217*a* and the first rail structure 218*a* enables the swing arm to slide therein. The first bump 217*a* is disposed on the side wall of the first rotating groove 21*a*, so that the swing arm mounted in the first rotating groove 21*a* can be limited, to help avoid a case that the swing arm mounted in the first rotating groove 21*a* leaves the first rotating groove 21*a*. For example, the first rail structure 218*a* may be curved.

In this embodiment of this application, a first hollowed-out portion 219*a* is disposed on the first rail structure 218*a*. The first hollowed-out portion 219*a* is disposed opposite to the first bump 217*a*. The first hollowed-out portion 219*a* penetrates the bottom wall of the first rotating groove 21*a* in the direction Z. It may be understood that, the arrangement of the first hollowed-out portion 219*a* can enable the first sub-bracket 201 to be made through mold shaping, thereby simplifying a machining process of the first sub-bracket 201, to help reduce production costs and improve production efficiency.

The second rotating groove 22*a* may include a third sliding rail 221*a* and two fourth sliding rails 222*a*. The third sliding rail 221*a* is disposed on a bottom wall of the second rotating groove 22*a*. The two fourth sliding rails 222*a* are respectively located on two side walls that are disposed opposite to each other and that are of the second rotating groove 22*a*. The two fourth sliding rails 222*a* are respectively located on two opposite sides of the third sliding rail 221*a*. The two fourth sliding rails 222*a* are disposed side by side with the third sliding rail 221*a* in the length direction (the direction Y) of the bracket 20. For example, the bottom wall of the second rotating groove 22*a* is curved.

It may be understood that, the third sliding rail 221*a* and the fourth sliding rail 222*a* enable the swing arms to slide thereon. Through a sliding movement of the swing arms on the third sliding rail 221*a* and the fourth sliding rail 222*a*, the rotating movement of the swing arms and the first sub-bracket 201 can be implemented. Under this arrangement, the second rotating groove 22*a* (a sliding groove of the swing arm) is disposed on the first sub-bracket 201, so that the space on the first sub-bracket 201 can be fully utilized to properly arrange a structure of the second rotating groove 22*a*. In comparison with the structure in which the sliding groove of the swing arm is disposed on the swing arm in a conventional technology, the swing arm occupies small space in the folded state, to help implement lightening and thinning of the entire machine.

In addition, the third sliding rail 221*a* and the two fourth sliding rails 222*a* are disposed in the second rotating groove 22*a*, so that the sliding trajectory of the swing arm is jointly limited by the third sliding rail 221*a* and the two fourth sliding rails 222*a*. On one hand, the sliding trajectory of the swing arm is jointly limited by the third sliding rail 221*a* and the two fourth sliding rails 222*a*, so that a precision requirement on the second rotating groove 22*a* can be reduced, thereby reducing the machining difficulty and the machining costs of the first sub-bracket 201. On the other hand, the sliding trajectory of the swing arm is jointly limited by the third sliding rail 221*a* and the two fourth sliding rails 222*a*, so that the third sliding rail 221*a* and the two fourth sliding rails 222*a* are arranged in a distributed manner. The plurality of sliding rails arranged in the distributed manner can increase strength of the second rotating groove 22*a*, so that the swing arm is not easily deformed and stuck when the swing arm slides on second sliding rails, and reliability is good.

Refer to FIG. 10 and FIG. 11 together. The third sliding rail 221*a* may include a second connecting portion 223*a* and two second convex portions 224*a*. The second connecting portion 223a and the two second convex portions 224a are all connected to the bottom wall of the second rotating groove 22a.

The two second convex portions 224a are disposed opposite to each other at intervals in the direction Y. A surface that is of each second convex portion 224a and that is away from the bottom wall of the second rotating groove 22a is a rail surface of the third sliding rail 221a. Each second convex portion 224a includes a third end 225a and a fourth end 226a. The third end 225a is an end that is of the second convex portion 224a and that is close to the edge of the first sub-bracket 201. The fourth end 226a is an end that is of the second convex portion 224a and that is away from the edge of the first sub-bracket 201. In other words, the third end 225a is disposed closer to the edge of the first sub-bracket 201 in comparison with the fourth end 226a. A height of a cross section that is of each second convex portion 224a and that is in a direction perpendicular to the bottom wall of the second rotating groove 22a gradually decreases from the third end 225a to the fourth end 226a. Under this arrangement, the third end 225a can be a high point position in the second convex portion 224a, and the fourth end 226a can be a low point position in the second convex portion 224a, so that a rail path of the third sliding rail 221a is arranged to gradually approach from the edge of the first sub-bracket 201 to the center of the first sub-bracket 201 from high to low; to help fully utilize the structure space of the first sub-bracket 201, so as to achieve a rail arrangement in which the third sliding rail 221a has a high-low drop and an inclined angle, and reliability is good. For example, the second convex portion 224a may be curved. A bending direction of the second convex portion 224a is approximately the same as a bending direction of the bottom wall of the second rotating groove 22a.

The second connecting portion 223a is connected between the third ends 225a of the two second convex portions 224a. In other words, the second connecting portion 223a is disposed close to the edge of the first sub-bracket 201. The second connecting portion 223a and the two second convex portions 224a cooperate to enclose mounting space C2. A mounting hole D2 is disposed on a groove bottom wall of the second rotating groove 22a. The mounting hole D2 penetrates the groove bottom wall of the second rotating groove 22a in the direction Z. The mounting hole D2 is located between the two second convex portions 224a and disposed close to the second connecting portion 223a. The mounting hole D2 and the mounting column 14 on the base 10 are correspondingly disposed, so that the mounting column 14 on the base 10 can pass through the mounting hole D2 to be located in the mounting space C2. Under this arrangement, on one hand, when the first sub-bracket 201 and the base 10 are assembled, the rapid positioning can be implemented through a corresponding arrangement of the mounting hole D2 and the mounting column 14, to help easily and quickly assemble the first sub-bracket 201 to the base 10. On the other hand, the clamping connection between the first sub-bracket 201 and the base 10 can be implemented through the corresponding arrangement of the mounting hole D2 and the mounting column 14, so that the relative movement between the first sub-bracket 201 and the base 10 is limited, and it is ensured that a displacement situation such as incline, misalignment, or shaking does not occur between the first sub-bracket 201 and the base 10. In addition, the mounting column 14 may be accommodated in the mounting space C2 formed through the cooperation of the second connecting portion 223a and the two convex portions, so that the space of the first sub-bracket 201 can be fully utilized without additionally occupying the space of the rotating mechanism 100, to effectively improve the space utilization of the first sub-bracket 201.

Still refer to FIG. 10 and FIG. 11. Each fourth sliding rail 222a is disposed at intervals with the third sliding rail 221a. The two fourth sliding rails 222a may be symmetrically distributed on two sides of the third sliding rail 221a. A bend direction of the two fourth sliding rails 222a may be the same as that of the third sliding rail 221a. Each fourth sliding rail 222a includes a second bump 227a and a second rail structure 228a. The second bump 227a is connected to a side wall of the second rotating groove 22a. The second rail structure 228a is connected to the bottom wall of the second rotating groove 22a. The second bump 227a and the second rail structure 228a are disposed at intervals. A gap area between the second bump 227a and the second rail structure 228a enables the swing arm to slide therein. The second bump 227a is disposed on the side wall of the second rotating groove 22a, so that the swing arm mounted in the second rotating groove 22a can be limited, to help avoid a case that the swing arm mounted in the second rotating groove 22a leaves the second rotating groove 22a. For example, the second rail structure 228a may be curved.

In this embodiment of this application, a second hollowed-out portion 229a is disposed on the second rail structure 228a. The second hollowed-out portion 229a is disposed opposite to the second bump 227a. The second hollowed-out portion 229a penetrates the bottom wall of the second rotating groove 22a in the direction Z. It may be understood that, the arrangement of the second hollowed-out portion 229a can enable the first sub-bracket 201 to be made through the mold shaping, thereby simplifying the machining process of the first sub-bracket 201, to help reduce the production costs and improve the production efficiency.

Still refer to FIG. 10 and FIG. 11. A third rotating groove 23a and a fourth rotating groove 24a are further disposed on the first sub-bracket 201. The third rotating groove 23a and the fourth rotating groove 24a are disposed at intervals in both the direction X and the direction Y. The third rotating groove 23a is disposed side by side with the first rotating groove 21a in the direction Y. A structure of the third rotating groove 23a is approximately the same as that of the first rotating groove 21a. The third rotating groove 23a may include a fifth sliding rail 231a and two sixth sliding rails 232a. The fifth sliding rail 231a is disposed on a bottom wall of the third rotating groove 23a. The two sixth sliding rails 232a are respectively disposed on two opposite side walls of the third rotating groove 23a. For structure designs of the fifth sliding rail 231a and the sixth sliding rail 232a, refer to the foregoing related descriptions of the first sliding rail 211a and the second sliding rail 212a in the first rotating groove 21a. The foregoing structure descriptions of the first sliding rail 211a and the second sliding rail 212a can be applied to the fifth sliding rail 231a and the sixth sliding rail 232a without conflict. The fourth rotating groove 24a is disposed side by side with the second rotating groove 22a in the direction Y. A structure of the fourth rotating groove 24a is approximately the same as that of the second rotating groove 22a. The fourth rotating groove 24a includes a seventh sliding rail 241a and two eighth sliding rails 242a. The seventh sliding rail 241a is disposed on a bottom wall of the fourth rotating groove 24a. The two eighth sliding rails 242a are respectively disposed on two opposite side walls of the fourth rotating groove 24a. For structure designs of the seventh sliding rail 241a and the eighth sliding rail 242a, refer to the foregoing related descriptions of the third sliding rail 221a and the fourth sliding rail 222a in the second rotating groove 22a. The foregoing structure descriptions of the third sliding rail 221a and the fourth sliding rail 222a can be applied to the seventh sliding rail 241a and the eighth sliding rail 242a without conflict.

Refer to FIG. 7 and FIG. 8 together. The second sub-bracket 202 and the first sub-bracket 201 may be a same or similar assembly, symmetrical or partially symmetrical structures, or different structures. In this embodiment of this application, the second sub-bracket 202 may include a first rotating groove 21b, a second rotating groove 22b, a third rotating groove 23b, and a fourth rotating groove 24b. The first rotating groove 21b and the second rotating groove 22b are disposed side by side in the direction X. The first rotating groove 21b and the second rotating groove 22b are symmetric relative to the symmetry axis O-axis. The third rotating groove 23b and the fourth rotating groove 24b are disposed side by side in the direction X. The third rotating groove 23b and the fourth rotating groove 24b are symmetric relative to the symmetry axis O-axis. The third rotating groove 23b and the first rotating groove 21b are disposed side by side in the direction Y. The fourth rotating groove 24b and the second rotating groove 22b are disposed side by side in the direction Y. For a basic structure of components in the second sub-bracket 202, a connection relationship between the components, and a connection relationship between the components and a component outside an assembly, refer to the related design of the first sub-bracket 201. The second sub-bracket 202 and the first sub-bracket 201 may be the same or different in terms of a detailed structure or a position arrangement of the components.

The third sub-bracket 203 and the first sub-bracket 201 may be a same or similar assembly, symmetrical or partially symmetrical structures, or different structures. In this embodiment, the third sub-bracket 203 includes a first rotating groove 21c and a second rotating groove 22c. The first rotating groove 21c and the second rotating groove 22c are disposed side by side in the direction X. The first rotating groove 21c and the second rotating groove 22c are symmetric relative to the symmetry axis O-axis. For a basic structure of components in the third sub-bracket 203, a connection relationship between the components, and a connection relationship between the components and a component outside an assembly, refer to the related design of the first sub-bracket 201.

The fourth sub-bracket 204 and the first sub-bracket 201 may be a same or similar assembly, symmetrical or partially symmetrical structures, or different structures. In this embodiment, the fourth sub-bracket 204 includes a first rotating groove 21d, a second rotating groove 22d, a third rotating groove 23d, and a fourth rotating groove 24d. The first rotating groove 21d and the second rotating groove 22d are disposed side by side in the direction X. The first rotating groove 21d and the second rotating groove 22d are symmetric relative to the symmetry axis O-axis. The third rotating groove 23d and the fourth rotating groove 24d are disposed side by side in the direction X. The third rotating groove 23d and the fourth rotating groove 24d are symmetric relative to the symmetry axis O-axis. The third rotating groove 23d and the first rotating groove 21d are disposed side by side in the direction Y. The fourth rotating groove 24d and the second rotating groove 22d are disposed side by side in the direction Y. For a basic structure of components in the fourth sub-bracket 204, a connection relationship between the components, and a connection relationship between the components and a component outside an assembly, refer to the related design of the first sub-bracket 201.

Figure 12:
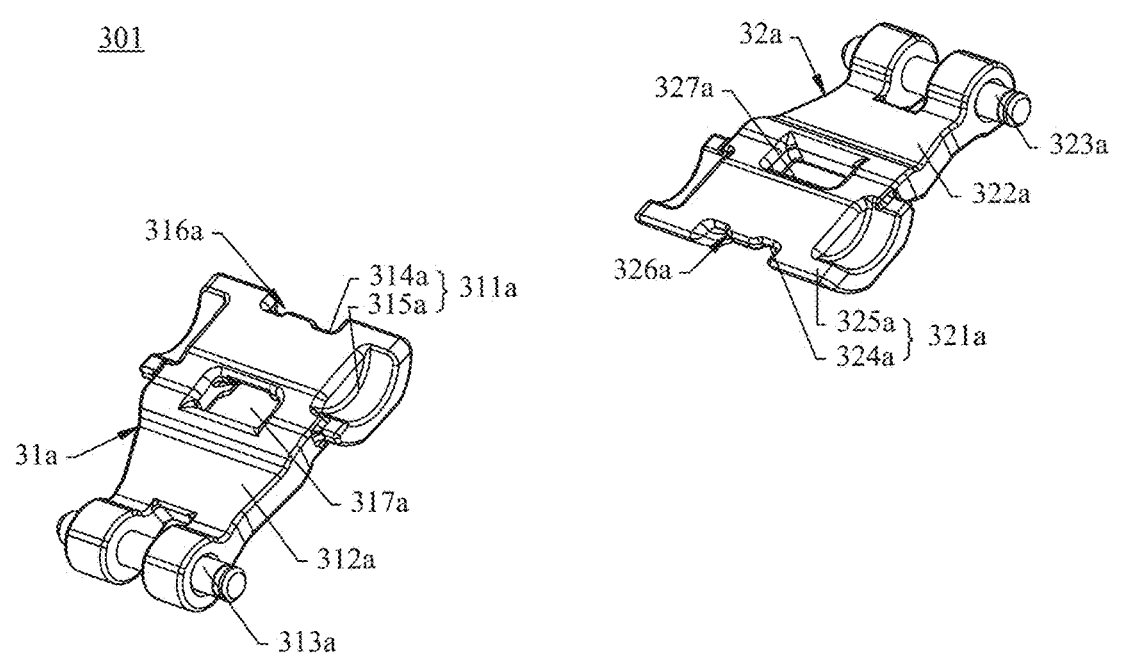
FIG. 12 is a schematic diagram of a structure of a first rotating swing arm assembly of rotating swing arm assemblies shown in FIG. 6.

Refer to FIG. 7 again. In this embodiment of this application, there are four rotating swing arm assemblies 30. The four rotating swing arm assemblies 30 are a first rotating swing arm assembly 301, a second rotating swing arm assembly 302, a third rotating swing arm assembly 303, and a fourth rotating swing arm assembly 304. The first rotating swing arm assembly 301, the second rotating swing arm assembly 302, the third rotating swing arm assembly 303, and the fourth rotating swing arm assembly 304 are sequentially arranged in the direction Y. The first rotating swing arm assembly 301 is located on one side of the negative direction toward the Y-axis of the base 10, and the fourth rotating swing arm assembly 304 is located on one side of the positive direction toward the Y-axis of the base 10. In another embodiment, there may be one, two, three, four or more rotating swing arm assemblies 30. A quantity of the rotating swing arm assembly 30 is not specifically limited in this application. Refer to FIG. 10 and FIG. 12 together. FIG. 12 is a schematic diagram of a structure of the first rotating swing arm assembly 301 of the rotating swing arm assemblies 30 shown in FIG. 6. The first rotating swing arm assembly 301 may include a first main swing arm 31a and a second main swing arm 32a. The first main swing arm 31a and the second main swing arm 32a are disposed at intervals in both the direction X and the direction Y.

The first main swing arm 31a is mounted in the first rotating groove 21a of the first sub-bracket 201. The first main swing arm 31a can rotate and slide relative to the first sub-bracket 201. The first main swing arm 31a may also be rotatably connected to a first fixing plate (not shown in the figure), so that when the first fixing plate rotates relative to the first sub-bracket 201, the first main swing arm 31a is driven to rotate and slide relative to the first sub-bracket 201. The first fixing plate may also be fixedly connected to the first housing 210, so that when the first housing 210 rotates relative to the first sub-bracket 201, the first fixing plate is driven to rotate relative to the first sub-bracket 201, to drive the first main swing arm 31a to rotate.

Figure 13:
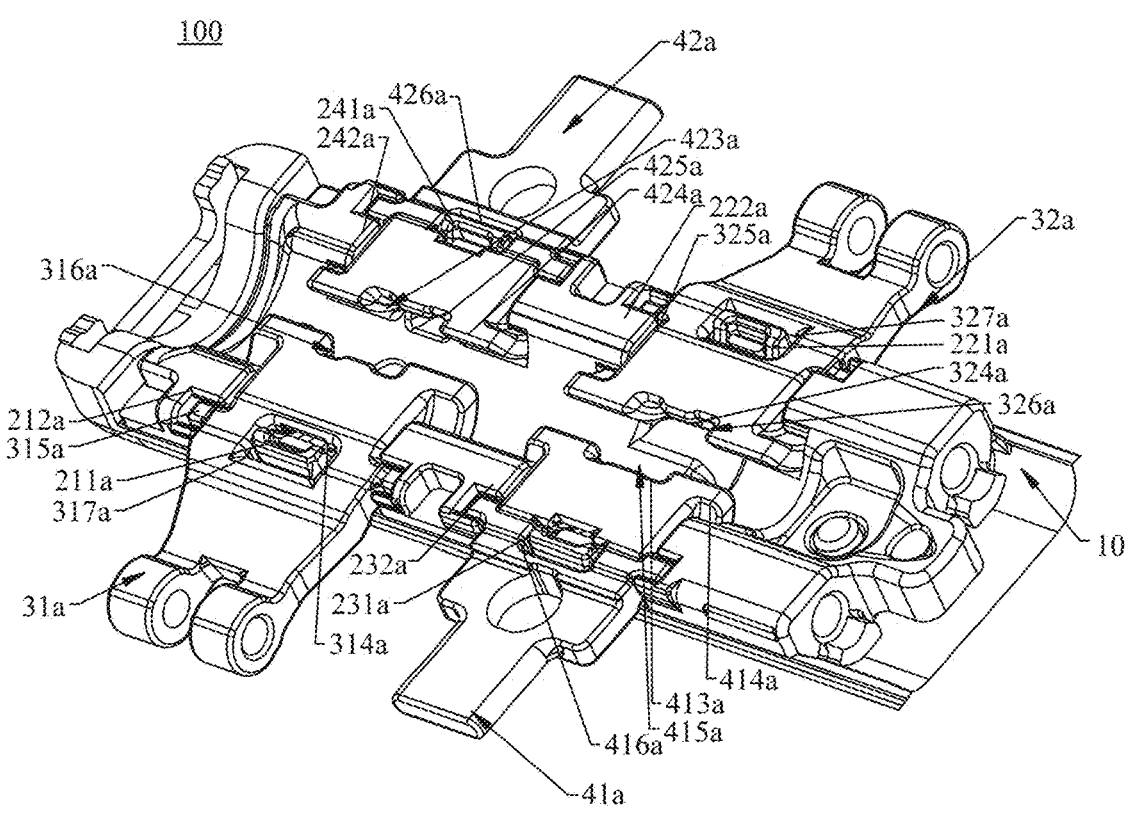
FIG. 13 is a schematic diagram of a state in which a part of the rotating mechanism shown in FIG. 6 is in an unfolded state.
Figure 14:
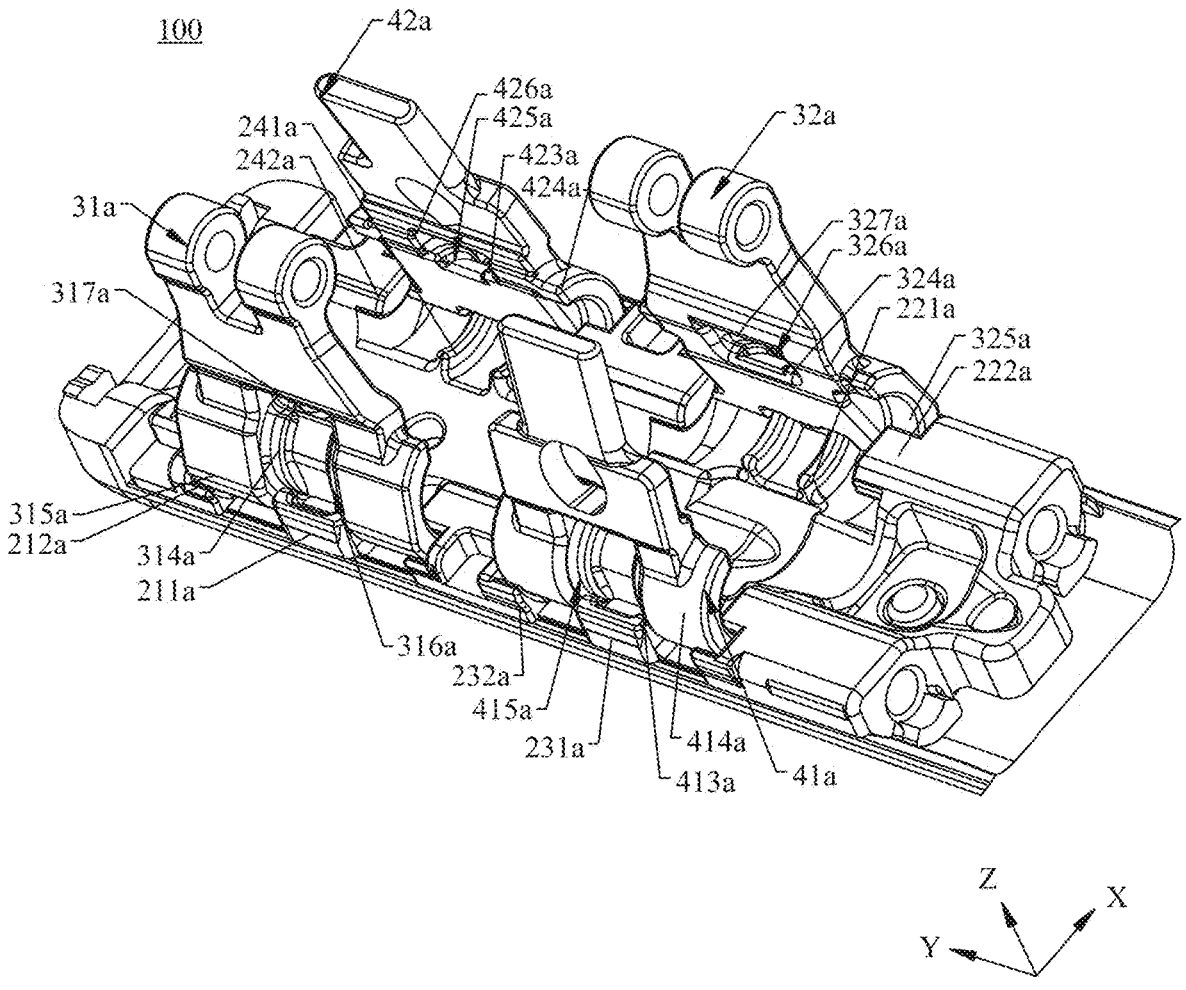
FIG. 14 is a schematic diagram of a state in which a part of the rotating mechanism shown in FIG. 6 is in a folded state.

Refer to FIG. 12, FIG. 13, and FIG. 14 together. FIG. 13 is a schematic diagram of a state in which a part of the rotating mechanism 100 shown in FIG. 6 is in an unfolded state. FIG. 14 is a schematic diagram of a state in which a part of the rotating mechanism 100 shown in FIG. 6 is in a folded state. The first main swing arm 31a may include a first rotating body 311a, a first swing body 312a, and a first rotary shaft 313a.

The first rotating body 311a is of a circular arc-shaped plate structure. The first rotating body 311a can slide and rotate along the first sliding rail 211a and the second sliding rail 212a in the first rotating groove 21a. Specifically, the first rotating body 311a includes a first sliding portion 314a and two second sliding portions 315a. The two second sliding portions 315a are respectively connected to two opposite sides that are of the first sliding portion 314a and that are in the direction X. The first sliding portion 314a is located between the two second sliding portions 315a. The first sliding portion 314a is mounted on the first sliding rail 211a, and the first sliding portion 314a can slide on the first sliding rail 211a. Each second sliding portion 315a is mounted on one second sliding rail 212a. Each second sliding portion 315a can slide on one second sliding rail 212a. To be specific, each second sliding portion 315a is located in the gap area between one first bump 217a and one first rail structure 218a. Under this arrangement, a structure of the first rotating body 311a can match the structure of the first rotating groove 21a of the first sub-bracket 201, a structure of the first sliding portion 314a can match a structure of the first sliding rail 211a, and a structure of the second sliding portion 315a can match a structure of the second sliding rail 212a, to facilitate a smooth rotating movement of the first main swing arm 31a relative to the first sub-bracket 201.

The first sliding portion 314a and the two second sliding portions 315a cooperate to form a first concave area 316a. The first sliding rail 211a can be partially accommodated in the first concave area 316a. Under this arrangement, the first sliding portion 314a is concave inward relative to the two second sliding portions 315a. When the first sliding portion 314a slides on the first sliding rail 211a, the first concave area 316a formed by the first sliding portion 314a being concave inward relative to the two second sliding portions 315a can provide space to accommodate the first sliding rail 211a, to help improve space utilization of the rotating mechanism 100 in a limited space layout, and reliability is good.

A first through hole 317a is further disposed on the first rotating body 311a. The first through hole 317a is in communication with the first concave area 316a. As shown in FIG. 13, when the rotating mechanism 100 is in the unfolded state, the first through hole 317a is for the first sliding rail 211a to pass through. Under this arrangement, the first sliding rail 211a and a rotating movement of the first main swing arm 31a can be prevented from affecting each other, to effectively avoid a problem that the rotating mechanism 100 is stuck because the first sliding rail 211a hinders the rotation of the first main swing arm 31a.

The first swing body 312a is of a plate structure. One end of the first swing body 312a is fixedly connected to the first rotating body 311a, and the other end is fixedly connected to the first rotary shaft 313a. An extension direction of an axis center of the first rotary shaft 313a is parallel to the direction Y, and the first rotary shaft 313a may be fixedly connected to the first fixing plate.

Refer to FIG. 10 and FIG. 12 together. The second main swing arm 32a is mounted in the second rotating groove 22a of the first sub-bracket 201. The second main swing arm 32a can rotate and slide relative to the first sub-bracket 201. The second main swing arm 32a may also be rotatably connected to a second fixing plate (not shown in the figure), so that when the second fixing plate rotates relative to the first sub-bracket 201, the second main swing arm 32a is driven to rotate and slide relative to the bracket 20. The second fixing plate may also be fixedly connected to the second housing 220, so that when the second housing 220 rotates relative to the first sub-bracket 201, the second fixing plate is driven to rotate relative to the first sub-bracket 201, to drive the second main swing arm 32a to rotate.

The second main swing arm 32a is mounted in the fourth rotating groove 24a of the first sub-bracket 201. The second main swing arm 32a can rotate and slide relative to the first sub-bracket 201. The second main swing arm 32a may also be rotatably connected to the second fixing plate (not shown in the figure), so that when the second fixing plate rotates relative to the first sub-bracket 201, the second main swing arm 32a is driven to rotate and slide relative to the first sub-bracket 201. The second fixing plate may also be fixedly connected to the second housing 220, so that when the second housing 220 rotates relative to the first sub-bracket 201, the second fixing plate is driven to rotate relative to the first sub-bracket 201, to drive the second main swing arm 32a to rotate.

Refer to FIG. 12, FIG. 13, and FIG. 14 together. The second main swing arm 32a may include a second rotating body 321a, a second swing body 322a, and a second rotary shaft 323a.

The second rotating body 321a is of a circular arc-shaped plate structure. The second rotating body 321a can slide and rotate along the third sliding rail 221a and the fourth sliding rail 222a in the second rotating groove 22a. Specifically, the second rotating body 321a includes a third sliding portion 324a and two fourth sliding portions 325a. The two fourth sliding portions 325a are respectively connected to two opposite sides that are of the third sliding portion 324a and that are in the direction X. The third sliding portion 324a is located between the two fourth sliding portions 325a. The third sliding portion 324a is mounted on the third sliding rail 221a, and the third sliding portion 324a can slide on the third sliding rail 221a. Each fourth sliding portion 325a is mounted on one fourth sliding rail 222a. Each fourth sliding portion 325a can slide on one fourth sliding rail 222a. To be specific, each fourth sliding portion 325a is located in the gap area between one second bump 227a and one second rail structure 228a. Under this arrangement, a structure of the second rotating body 321a can match the structure of the second rotating groove 22a of the first sub-bracket 201, a structure of the third sliding portion 324a can match a structure of the third sliding rail 221a, and a structure of the fourth sliding portion 325a can match a structure of the fourth sliding rail 222a, to facilitate a smooth rotating movement of the second main swing arm 32a relative to the first sub-bracket 201.

The third sliding portion 324a and the two fourth sliding portions 325a cooperate to form a second concave area 326a. The third sliding rail 221a can be partially accommodated in the second concave area 326a. Under this arrangement, the third sliding portion 324a is concave inward relative to the two fourth sliding portions 325a. When the third sliding portion 324a slides on the third sliding rail 221a, the second concave area 326a formed by the third sliding portion 324a being concave inward relative to the two fourth sliding portions 325a can provide space to accommodate the third sliding rail 221a, to help improve the space utilization of the rotating mechanism 100 in the limited space layout, and the reliability is good.

A second through hole 327a is further disposed on the second rotating body 321a. The second through hole 327a is in communication with the second concave area 326a. As shown in FIG. 13, when the rotating mechanism 100 is in the unfolded state, the second through hole 327a is for the second sliding rail 212a to pass through. Under this arrangement, the second sliding rail 212a and a rotating movement of the second main swing arm 32a can be prevented from affecting each other, to effectively avoid a problem that the rotating mechanism 100 is stuck because the second sliding rail 212a hinders the rotation of the second main swing arm 32a.

The second swing body 322a is of a plate structure. One end of the second swing body 322a is fixedly connected to the second rotating body 321a, and the other end is fixedly connected to the second rotary shaft 323a. An extension direction of an axis center of the second rotary shaft 323a is parallel to the direction Y, and the second rotary shaft 323a may be fixedly connected to the second fixing plate.

In this embodiment of this application, a rotation direction of the first main swing arm 31a is opposite to that of the second main swing arm 32a. For example, when the rotating mechanism 100 switches from a flattened state to the folded state, the first main swing arm 31a rotates clockwise, and the second main swing arm 32*a* rotates anticlockwise. When the rotating mechanism 100 switches from the folded state to the flattened state, the first main swing arm 31*a* rotates anticlockwise, and the second main swing arm 32*a* rotates clockwise.

Refer to FIG. 7. The second rotating swing arm assembly 302 and the first rotating swing arm assembly 301 may be a same or similar assembly, symmetrical or partially symmetrical structures, or different structures. In this embodiment, the second rotating swing arm assembly 302 includes a first main swing arm 31*b* and a second main swing arm 32*b*. The first main swing arm 31*b* may be mounted in the first rotating groove 21*b* of the second sub-bracket 202. The second main swing arm 32*b* may be mounted in the second rotating groove 22*b* of the second sub-bracket 202. The first main swing arm 31*b* and the second main swing arm 32*b* are disposed side by side in the direction X. The first main swing arm 31*b* and the second main swing arm 32*b* are symmetric relative to the symmetry axis O-axis. For a basic structure of components in the second rotating swing arm assembly 302, a connection relationship between the components, and a connection relationship between the components and a component outside an assembly, refer to the related design of the first rotating swing arm assembly 301. The second rotating swing arm assembly 302 and the first rotating swing arm assembly 301 may be the same or different in terms of a detailed structure or a position arrangement of the components. This is not specifically limited in this application.

The third rotating swing arm assembly 303 and the first rotating swing arm assembly 301 may be a same or similar assembly, symmetrical or partially symmetrical structures, or different structures. In this embodiment, the third rotating swing arm assembly 303 includes a first main swing arm 31*c* and a second main swing arm 32*c*. The first main swing arm 31*c* may be mounted in the first rotating groove 21*c* of the third sub-bracket 203. The second main swing arm 32*c* may be mounted in the second rotating groove 22*c* of the third sub-bracket 203. The first main swing arm 31*c* and the second main swing arm 32*c* are disposed side by side in the direction X. The first main swing arm 31*c* and the second main swing arm 32*c* are symmetric relative to the symmetry axis O-axis. For a basic structure of components in the third rotating swing arm assembly 303, a connection relationship between the components, and a connection relationship between the components and a component outside an assembly, refer to the related design of the first rotating swing arm assembly 301. The third rotating swing arm assembly 303 and the first rotating swing arm assembly 301 may be the same or different in terms of a detailed structure or a position arrangement of the components. This is not specifically limited in this application.

The fourth rotating swing arm assembly 304 and the first rotating swing arm assembly 301 may be a same or similar assembly, symmetrical or partially symmetrical structures, or different structures. In this embodiment, the fourth rotating swing arm assembly 304 includes a first main swing arm 31*d* and a second main swing arm 32*d*. The first main swing arm 31*d* may be mounted in the first rotating groove 21*d* of the fourth sub-bracket 204. The second main swing arm 32*d* may be mounted in the second rotating groove 22*d* of the fourth sub-bracket 204. The first main swing arm 31*d* and the second main swing arm 32*d* are disposed side by side in the direction X. The first main swing arm 31*d* and the second main swing arm 32*d* are symmetric relative to the symmetry axis O-axis. For a basic structure of components in the fourth rotating swing arm assembly 304, a connection relationship between the components, and a connection relationship between the components and a component outside an assembly, refer to the related design of the first rotating swing arm assembly 301. The fourth rotating swing arm assembly 304 and the first rotating swing arm assembly 301 may be the same or different in terms of a detailed structure or a position arrangement of the components. This is not specifically limited in this application.

Refer to FIG. 7 again. In this embodiment of this application, there are three pressing plate swing arm assemblies 40. The three pressing plate swing arm assemblies 40 are a first pressing plate swing arm assembly 401, a second pressing plate swing arm assembly 402, and a third pressing plate swing arm assembly 403. The first pressing plate swing arm assembly 401, the second pressing plate swing arm assembly 402, and the third pressing plate swing arm assembly 403 are sequentially arranged in the direction Y. The first pressing plate swing arm assembly 401 is located on one side of the negative direction toward the Y-axis of the base 10, and the third pressing plate swing arm assembly 403 is located on one side of the positive direction toward the Y-axis of the base 10. In another embodiment, there may be one, two, three, four or more pressing plate swing arm assemblies 40. A quantity of the pressing plate swing arm assembly 40 is not specifically limited in this application.

Figure 15:
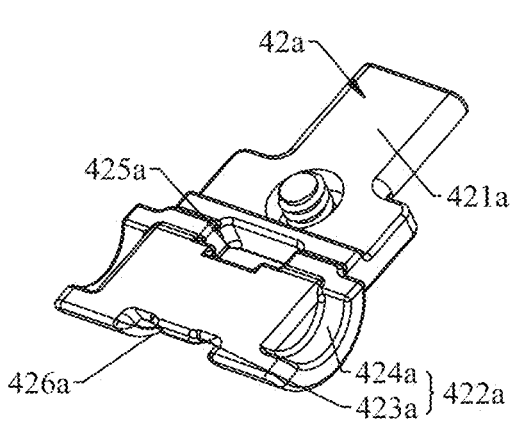
FIG. 15 is a schematic diagram of a structure of a first pressing plate swing arm assembly of pressing plate swing arm assemblies shown in FIG. 6.
Figure 15:
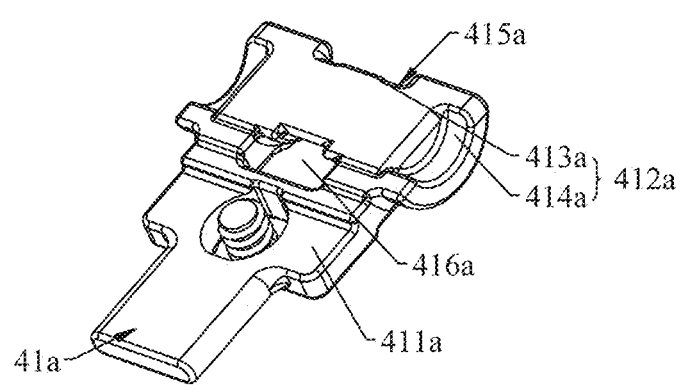

Refer to FIG. 10 and FIG. 15 together. FIG. 15 is a schematic diagram of a structure of the first pressing plate swing arm assembly 401 of the pressing plate swing arm assemblies 40 shown in FIG. 6. The first pressing plate swing arm assembly 401 may include a first pressing plate swing arm 41*a* and a second pressing plate swing arm 42*a*. The first pressing plate swing arm 41*a* and the second pressing plate swing arm 42*a* are disposed at intervals in both the direction X and the direction Y.

The first pressing plate swing arm 41*a* is mounted in the third rotating groove 23*a* of the first sub-bracket 201. The first pressing plate swing arm 41*a* can rotate and slide relative to the first sub-bracket 201. The first pressing plate swing arm 41*a* may also be slidably connected to a first pressing plate (not shown in the figure). The first pressing plate may be slidably connected to the first fixing plate. In this way, when the first fixing plate rotates relative to the first sub-bracket 201, the first pressing plate swing arm 41*a* is driven to rotate and slide relative to the first sub-bracket 201. It may be understood that, when the first housing 210 rotates relative to the first sub-bracket 201, the first fixing plate is driven by the first housing 210 to rotate relative to the first sub-bracket 201, the first pressing plate is driven by the first fixing plate to rotate relative to the first sub-bracket 201, and the first pressing plate slides relative to the first fixing plate. In addition, the first pressing plate swing arm 41*a* is driven by the first pressing plate to rotate relative to the first sub-bracket 201.

Refer to FIG. 13, FIG. 14, and FIG. 15 together. FIG. 13 is a schematic diagram of a state in which a part of the rotating mechanism 100 shown in FIG. 6 is in an unfolded state. FIG. 14 is a schematic diagram of a state in which a part of the rotating mechanism 100 shown in FIG. 6 is in a folded state. The first pressing plate swing arm 41*a* may include a first pressing plate swing body 411*a* and a first pressing plate rotating body 412*a*.

The first pressing plate rotating body 412*a* is of a circular arc-shaped plate structure. The first pressing plate rotating body 412*a* can slide and rotate along the fifth sliding rail 231*a* and the sixth sliding rail 232*a* in the third rotating groove 23*a*. Specifically, the first pressing plate rotating body 412*a* includes a fifth sliding portion 413*a* and two sixth sliding portions 414*a*. The two sixth sliding portions 414*a* are respectively connected to two opposite sides that are of the fifth sliding portion 413a and that are in the direction X. The fifth sliding portion 413a is located between the two sixth sliding portions 414a. The fifth sliding portion 413a is mounted on the fifth sliding rail 231a, and the fifth sliding portion 413a can slide on the fifth sliding rail 231a. Each sixth sliding portion 414a is mounted on one sixth sliding rail 232a. Each sixth sliding portion 414a can slide on one sixth sliding rail 232a. Under this arrangement, a structure of the first pressing plate rotating body 412a can match the structure of the third rotating groove 23a of the first sub-bracket 201, a structure of the fifth sliding portion 413a can match a structure of the fifth sliding rail 231a, and a structure of the sixth sliding portion 414a can match a structure of the sixth sliding rail 232a, to facilitate a smooth rotating movement of the first pressing plate swing arm 41a relative to the first sub-bracket 201.

The fifth sliding portion 413a and the two sixth sliding portions 414a cooperate to form a third concave area 415a. The fifth sliding rail 231a can be partially accommodated in the third concave area 415a. Under this arrangement, the fifth sliding portion 413a is concave inward relative to the two sixth sliding portions 414a. When the fifth sliding portion 413a slides on the fifth sliding rail 231a, the third concave area 415a formed by the fifth sliding portion 413a, being concave inward relative to the two sixth sliding portions 414a can provide space to accommodate the fifth sliding rail 231a, to help improve the space utilization of the rotating mechanism 100 in the limited space layout, and the reliability is good.

A third through hole 416a is further disposed on the first pressing plate rotating body 412a. The third through hole 416a is in communication with the third concave area 415a. As shown in FIG. 13, when the rotating mechanism 100 is in the unfolded state, the third through hole 416a is for the fifth sliding rail 231a to pass through. Under this arrangement, the fifth sliding rail 231a and a rotating movement of the first pressing plate swing arm 41a can be prevented from affecting each other, to effectively avoid a problem that the rotating mechanism 100 is stuck because the fifth sliding rail 231a hinders the rotation of the first pressing plate swing arm 41a.

The first pressing plate swing body 411a is of a plate structure. One end of the first pressing plate swing body 411a is fixedly connected to the first pressing plate rotating body 412a, and the other end is slidably connected to the first pressing plate.

Refer to FIG. 10 and FIG. 15 together. The second pressing plate swing arm 42a is mounted in the fourth rotating groove 24a of the first sub-bracket 201. The second pressing plate swing arm 42a can rotate and slide relative to the first sub-bracket 201. The second pressing plate swing arm 42a may also be slidably connected to a second pressing plate (not shown in the figure). The second pressing plate may be slidably connected to the second fixing plate. In this way, when the second fixing plate rotates relative to the first sub-bracket 201, the second pressing plate swing arm 42a is driven to rotate and slide relative to the first sub-bracket 201. It may be understood that, when the second housing 220 rotates relative to the first sub-bracket 201, the second fixing plate is driven by the second housing 220 to rotate relative to the first sub-bracket 201, the second pressing plate is driven by the second fixing plate to rotate relative to the first sub-bracket 201, and the second pressing plate slides relative to the second fixing plate. In addition, the second pressing plate swing arm 42a is driven by the second pressing plate to rotate relative to the first sub-bracket 201.

Refer to FIG. 13, FIG. 14, and FIG. 15 together. The second pressing plate swing arm 42a may include a second pressing plate swing body 421a and a second pressing plate rotating body 422a.

The second pressing plate rotating body 422a is of a circular arc-shaped plate structure. The second pressing plate rotating body 422a can slide and rotate along the seventh sliding rail 241a and the eighth sliding rail 242a in the fourth rotating groove 24a. Specifically, the second pressing plate rotating body 422a includes a seventh sliding portion 423a and two eighth sliding portions 424a. The two eighth sliding portions 424a are respectively connected to two opposite sides that are of the seventh sliding portion 423a and that are in the direction X. The seventh sliding portion 423a is located between the two eighth sliding portions 424a. The seventh sliding portion 423a is mounted on the seventh sliding rail 241a, and the seventh sliding portion 423a can slide on the seventh sliding rail 241a. Each eighth sliding portion 424a is mounted on one eighth sliding rail 242a. Each eighth sliding portion 424a can slide on one eighth sliding rail 242a. Under this arrangement, a structure of the second pressing plate rotating body 422a can match the structure of the fourth rotating groove 24a of the first sub-bracket 201, a structure of the seventh sliding portion 423a can match a structure of the seventh sliding rail 241a, and a structure of the eighth sliding portion 424a can match a structure of the eighth sliding rail 242a, to facilitate a smooth rotating movement of the second pressing plate swing arm 42a relative to the first sub-bracket 201.

The seventh sliding portion 423a and the two eighth sliding portions 424a cooperate to form a fourth concave area 425a. The seventh sliding rail 241a can be partially accommodated in the fourth concave area 425a. Under this arrangement, the seventh sliding portion 423a is concave inward relative to the two eighth sliding portions 424a. When the seventh sliding portion 423a slides on the seventh sliding rail 241a, the fourth concave area 425a formed by the seventh sliding portion 423a being concave inward relative to the two eighth sliding portions 424a can provide space to accommodate the seventh sliding rail 241a, to help improve the space utilization of the rotating mechanism 100 in the limited space layout, and the reliability is good.

A fourth through hole 426a is further disposed on the second pressing plate rotating body 422a. The fourth through hole 426a is in communication with the fourth concave area 425a. As shown in FIG. 13, when the rotating mechanism 100 is in the unfolded state, the fourth through hole 426a is for the seventh sliding rail 241a to pass through. Under this arrangement, the seventh sliding rail 241a and a rotating movement of the second pressing plate swing arm 42a can be prevented from affecting each other, to effectively avoid a problem that the rotating mechanism 100 is stuck because the seventh sliding rail 241a hinders the rotation of the second pressing plate swing arm 42a.

The second pressing plate swing body 421a is of a plate structure. One end of the second pressing plate swing body 421a is fixedly connected to the second pressing plate rotating body 422a, and the other end is slidably connected to the second pressing plate.

In this embodiment of this application, a rotation direction of the first pressing plate swing arm 41a is opposite to that of the second pressing plate swing arm 42a. For example, when the rotating mechanism 100 switches from a flattened state to the folded state, the first pressing plate swing arm 41a rotates clockwise, and the second pressing plate swing arm 42a rotates anticlockwise. When the rotating mechanism 100 switches from the folded state to the flattened state, the first pressing plate swing arm 41*a* rotates anticlockwise, and the second pressing plate swing arm 42*a* rotates clockwise.

Refer to FIG. 7. The second pressing plate swing arm assembly 402 and the first pressing plate swing arm assembly 401 may be a same or similar assembly, symmetrical or partially symmetrical structures, or different structures. In this embodiment, the second pressing plate swing arm assembly 402 includes a first pressing plate swing arm 41*b* and a second pressing plate swing arm 42*b*. The first pressing plate swing arm 41*b* may be mounted in the third rotating groove 23*b* of the second sub-bracket 202. The second pressing plate swing arm 42*b* may be mounted in the fourth rotating groove 24*b* of the second sub-bracket 202. The first pressing plate swing arm 41*b* and the second pressing plate swing arm 42*b* are disposed side by side in the direction X. The first pressing plate swing arm 41*b* and the second pressing plate swing arm 42*b* are symmetric relative to the symmetry axis O-axis. For a basic structure of components in the second pressing plate swing arm assembly 402, a connection relationship between the components, and a connection relationship between the components and a component outside an assembly, refer to a related design of the first pressing plate swing arm assembly 401. The second pressing plate swing arm assembly 402 and the first pressing plate swing arm assembly 401 may be the same or different in terms of a detailed structure or a position arrangement of the components. This is not specifically limited in this application.

The third pressing plate swing arm assembly 403 and the first pressing plate swing arm assembly 401 may be a same or similar assembly, symmetrical or partially symmetrical structures, or different structures. In this embodiment, the third pressing plate swing arm assembly 403 includes a first pressing plate swing arm 41*c* and a second pressing plate swing arm 42*c*. The first pressing plate swing arm 41*c* may be mounted in the third rotating groove 23*c* of the fourth sub-bracket 204. The second pressing plate swing arm 42*c* may be mounted in the fourth rotating groove 24*c* of the fourth sub-bracket 204. The first pressing plate swing arm 41*c* and the second pressing plate swing arm 42*c* are disposed side by side in the direction X. The first pressing plate swing arm 41*c* and the second pressing plate swing arm 42*c* are symmetric relative to the symmetry axis O-axis. For a basic structure of components in the third pressing plate swing arm assembly 403, a connection relationship between the components, and a connection relationship between the components and a component outside an assembly, refer to the related design of the first pressing plate swing arm assembly 401. The third pressing plate swing arm assembly 403 and the first pressing plate swing arm assembly 401 may be the same or different in terms of a detailed structure or a position arrangement of the components. This is not specifically limited in this application.

The embodiment of this application is described in detail above. The principles and the implementations of this application are described in this specification by using specific examples. The foregoing descriptions about the embodiment are merely provided to help understand the method and the core idea of this application. In addition, a person of ordinary skill in the art can make changes to the specific implementations and the application scope according to the idea of this application. Therefore, the content of this specification shall not be understood as a limitation on this application.

The invention claimed is:

1. An electronic device, comprising:
a first housing;
a second housing; and
a rotating mechanism connected between the first housing and the second housing, wherein the rotating mechanism comprises a bracket, a first main swing arm, and a second main swing arm;
wherein a first rotating groove and a second rotating groove are disposed on the bracket, and the first rotating groove and the second rotating groove are distributed on two opposite sides of the bracket;
wherein the first rotating groove comprises a first sliding rail and two second sliding rails, the two second sliding rails are respectively located on two opposite sides of the first sliding rail and are disposed side by side with the first sliding rail in a length direction of the bracket, the first main swing arm is mounted in the first rotating groove, the first main swing arm can slide on the first sliding rail and the two second sliding rails, and the first main swing arm can rotate relative to the bracket;
wherein the second rotating groove comprises a third sliding rail and two fourth sliding rails, the two fourth sliding rails are respectively located on two opposite sides of the third sliding rail and are disposed side by side with the third sliding rail in the length direction of the bracket, the second main swing arm is mounted in the second rotating groove, the second main swing arm can slide on the third sliding rail and the two fourth sliding rails, the second main swing arm can rotate relative to the bracket, and a rotation direction of the second main swing arm is opposite to that of the first main swing arm; and
wherein the first main swing arm comprises a first sliding portion and two second sliding portions, the two second sliding portions are connected to two opposite sides of the first sliding portion, the first sliding portion is mounted on the first sliding rail, and each second sliding portion is mounted on one second sliding rail.

2. The electronic device according to claim 1, wherein the first sliding portion and the two second sliding portions cooperate to form a first concave area, and the first sliding rail is partially located in the first concave area.

3. The electronic device according to claim 2, wherein a first through hole is disposed on the first main swing arm, the first through hole is in communication with the first concave area, and the first through hole is for the first sliding rail to pass through.

4. The electronic device according to claim 1,
wherein the first sliding rail comprises two first convex portions disposed opposite to each other;
wherein a surface of each first convex portion of the two first convex portions that is away from a bottom wall of the first rotating groove is in contact with the first sliding portion; and
wherein each first convex portion of the two first convex portions comprises a first end and a second end, the first end is disposed closer to an edge of the bracket in comparison with the second end, and a height of a cross section that is of each first convex portion and that is in a direction perpendicular to the bottom wall of the first rotating groove gradually decreases from the first end to the second end.

5. The electronic device according to claim 4,
wherein the rotating mechanism further comprises a base;
wherein the bracket is fixed to the base, a mounting column is disposed on the base;
wherein the first sliding rail further comprises a first connecting portion, the first connecting portion is connected between the first ends of the two first convex portions, the first connecting portion and the two first convex portions cooperate to enclose mounting space; and wherein a mounting hole is disposed on the bracket, the mounting hole is located between the two first convex portions and disposed close to the first connecting portion, the mounting column passes through the mounting hole, and the mounting column is located in the mounting space.

6. The electronic device according to claim 1, wherein the first sliding rail comprises a first bump and a first rail structure, the first bump is connected to a side wall of the first rotating groove, the first rail structure is connected to the bottom wall of the first rotating groove, the first bump and the first rail structure are disposed at intervals, and the second sliding portion is located in a gap area between the first bump and the first rail structure.

7. The electronic device according to claim 6, wherein a first hollowed-out portion is disposed on the first rail structure, the first hollowed-out portion is disposed opposite to the first bump, and the first hollowed-out portion penetrates the bottom wall of the first rotating groove.

8. The electronic device according to claim 1, wherein the first rotating groove and the second rotating groove are of an integrated structure.

9. The electronic device according to claim 1, wherein the rotating mechanism further comprises a base, wherein the bracket is fixed to the base, and orthographic projections that are of the first rotating groove and the second rotating groove and that are on the base entirely fall on the base.

\*    \*    \*    \*    \*